United States Patent
Allenic et al.

(10) Patent No.: US 9,799,784 B2
(45) Date of Patent: Oct. 24, 2017

(54) HIGH EFFICIENCY PHOTOVOLTAIC DEVICE EMPLOYING CADMIUM SULFIDE TELLURIDE AND METHOD OF MANUFACTURE

(71) Applicant: FIRST SOLAR, INC, Perrysburg, OH (US)

(72) Inventors: Arnold Allenic, San Jose, CA (US); Zhigang Ban, Perrysburg, OH (US); Benyamin Buller, Sylvania, OH (US); Markus Gloeckler, Perrysburg, OH (US); Benjamin Milliron, Toledo, OH (US); Xilin Peng, Bloomington, MN (US); Rick C. Powell, Ann Arbor, MI (US); Jigish Trivedi, Perrysburg, OH (US); Oomman K. Varghese, Houston, TX (US); Jianjun Wang, Perrysburg, OH (US); Zhibo Zhao, Novi, MI (US)

(73) Assignee: First Solar, Inc., Perrysburg, OH (US)

( * ) Notice: Subject to any disclaimer, the term of this patent is extended or adjusted under 35 U.S.C. 154(b) by 96 days.

(21) Appl. No.: 14/209,740

(22) Filed: Mar. 13, 2014

(65) Prior Publication Data
US 2014/0261688 A1 Sep. 18, 2014

Related U.S. Application Data

(60) Provisional application No. 61/792,153, filed on Mar. 15, 2013, provisional application No. 61/792,233, filed on Mar. 15, 2013.

(51) Int. Cl.
*H01L 31/0296* (2006.01)
*H01L 31/18* (2006.01)
(Continued)

(52) U.S. Cl.
CPC .... *H01L 31/0296* (2013.01); *H01L 31/02963* (2013.01); *H01L 31/02966* (2013.01);
(Continued)

(58) Field of Classification Search
CPC ..... H01L 31/00; H01L 31/02; H01L 31/0248; H01L 31/0256; H01L 31/0272;
(Continued)

(56) References Cited

U.S. PATENT DOCUMENTS

| 4,069,356 A | 1/1978 | Fischer |
| 5,248,349 A | 9/1993 | Foote et al. |

(Continued)

FOREIGN PATENT DOCUMENTS

| EP | 2333844 | 6/2011 |
| WO | WO 2011049933 | 4/2011 |
| WO | WO 2011126454 | 10/2011 |

OTHER PUBLICATIONS

Kevin D. Dobson et al., "Stability of CdTe/CdS thin-film solar cells", Solar Energy Materials & Solar Cells, Jan. 2000, pp. 295-325.
(Continued)

*Primary Examiner* — Christina Chern
(74) *Attorney, Agent, or Firm* — MacMillan, Sobanski & Todd, LLC

(57) ABSTRACT

A photovoltaic device is disclosed including at least one Cadmium Sulfide Telluride ($CdS_xTe_{1-x}$) layer as are methods of forming such a photovoltaic device.

26 Claims, 14 Drawing Sheets

(51) Int. Cl.
   *H01L 31/0392*   (2006.01)
   *H01L 31/073*   (2012.01)
(52) U.S. Cl.
   CPC ...... *H01L 31/03925* (2013.01); *H01L 31/073* (2013.01); *H01L 31/18* (2013.01); *H01L 31/1832* (2013.01); *Y02E 10/543* (2013.01)
(58) Field of Classification Search
   CPC ........... H01L 31/0296; H01L 31/02963; H01L 31/03925; H01L 31/0445
   See application file for complete search history.

(56) References Cited

U.S. PATENT DOCUMENTS

| | | | |
|---|---|---|---|
| 5,261,968 | A | 11/1993 | Jordan |
| 5,578,502 | A | 11/1996 | Albright et al. |
| 5,945,163 | A | 8/1999 | Powell et al. |
| 7,939,363 | B1 | 5/2011 | Johnson et al. |
| 8,039,290 | B2 | 10/2011 | Feldman-Peabody et al. |
| 2009/0242029 | A1 | 10/2009 | Paulson et al. |
| 2010/0273287 | A1 | 10/2010 | Weiner et al. |
| 2011/0088768 | A1 | 4/2011 | Gloeckler et al. |
| 2011/0120373 | A1 | 5/2011 | Bollman et al. |
| 2011/0139240 | A1 | 6/2011 | Allenic et al. |
| 2011/0139247 | A1 | 6/2011 | Feldman-Peabody |
| 2011/0143492 | A1 | 6/2011 | DeLuca et al. |
| 2011/0240123 | A1 | 10/2011 | Lin et al. |
| 2011/0259424 | A1 | 10/2011 | Basol |
| 2011/0265874 | A1 | 11/2011 | Gossman et al. |
| 2011/0269261 | A1 | 11/2011 | Drayton et al. |
| 2011/0290308 | A1 | 12/2011 | Korevaar |
| 2012/0052620 | A1 | 3/2012 | Feldman-Peabody et al. |
| 2012/0052621 | A1 | 3/2012 | Feldman-Peabody et al. |
| 2012/0103261 | A1 | 5/2012 | Johnson et al. |
| 2012/0132268 | A1* | 5/2012 | Rojo ................... H01L 31/1884 136/256 |
| 2012/0260978 | A1* | 10/2012 | Korevaar .......... H01L 31/03529 136/255 |

OTHER PUBLICATIONS

Joel N. Duenow, et al., "CdS/CdTe Solar Cells Containing Directly Deposited $CdS_xTe_{1-x}$ Alloy Layers", Conference Paper, NREL/CP-5200-50755, Jul. 2011.

A.D. Compaan, et al., "Critical Issues and Research Needs for CdTe-Based Solar Cells", htttp://www.udel.edu/iec/Resumes/Birkmire/Pubs/RwB90.pdf, Pub. 1999.

M.A. Santana-Aranda, et al., "Screen printed $CdS_xTe_{1-x}$ films, structural and optical characterization", Applied Surface Science 175-176 (2001) p. 538-542.

M.A. Matin, et al., "Prospects of novel front and back contacts for high efficiency cadmium telluride thin film solar cells from numerical analysis", Solar Energy Materials and Solar Cells, vol. 94, Issue 9, Sep. 2010.

R. Radojcic, et al., "Preparation and Properties of Graded Band Gap $CdS_xTe_{1-x}$ Thin Film Solar Cells", Solar Cells, 4 (1981) p. 121-126.

D.W. Lane, "A review of the optical band gap of thin film $CdS_xTe_{1-x}$", Solar Energy Materials and Solar Cells 90 (2006) p. 1169-1175.

D.A. Wood, et al., "Optical and structural characterizationof $CdS_xTe_{1-x}$ thin films for solar cell applications", Journal of Physics: Condensed Matter, vol. 12, No. 19.

R.S. Singh, et al., "Nano-structure CdTe, Cds and $TiO_2$ for thin film solar cell applications", Solar Energy Materials and Cells 82 (2004), p. 315-330.

Brian E. McCandless, et al., "Influence of Window and Absorber Layer Processing on Device Operation in Superstrate Thin Film Cote Solar Cells", IEEE 2000, pp. 491-494.

Victor Plotnikov, "Fabrication of ultra thin CdS/CdTe solar cells by magnetron sputtering", The University of Toledo, Aug. 2009.

* cited by examiner

HIGH EFFICIENCY PHOTOVOLTAIC DEVICE EMPLOYING CADMIUM SULFIDE TELLURIDE AND METHOD OF MANUFACTURE

CROSS-REFERENCE TO RELATED APPLICATION

This application claims priority to U.S. Provisional Application No. 61/792,153, filed on Mar. 15, 2013 and U.S. Provisional Application No. 61/792,233, filed on Mar. 15, 2013, which are hereby fully incorporated by reference.

TECHNICAL FIELD

This disclosure relates generally to photovoltaic (PV) devices, and more specifically, to high efficiency thin film PV devices and methods for manufacturing such devices.

BACKGROUND

Photovoltaic (PV) devices are PV cells or PV modules containing a plurality of PV cells or any device that converts photo-radiation or light into electricity. Generally, a thin film PV device includes two conductive electrodes sandwiching a series of semiconductor layers. The semiconductor layers provide an n-type window layer in close proximity to a p-type absorber layer to form a p-n junction. During operation, light passes through the window layer, and is absorbed by the absorber layer. The absorber layer produces photo-generated electron-hole pairs, the movement of which, promoted by a built-in electric field generated at the p-n junction, produces electric current that can be output through the two electrodes.

There is an ever present desire to increase the efficiency of a PV device in the photoconversion process.

DETAILED DESCRIPTION

Figure 1:
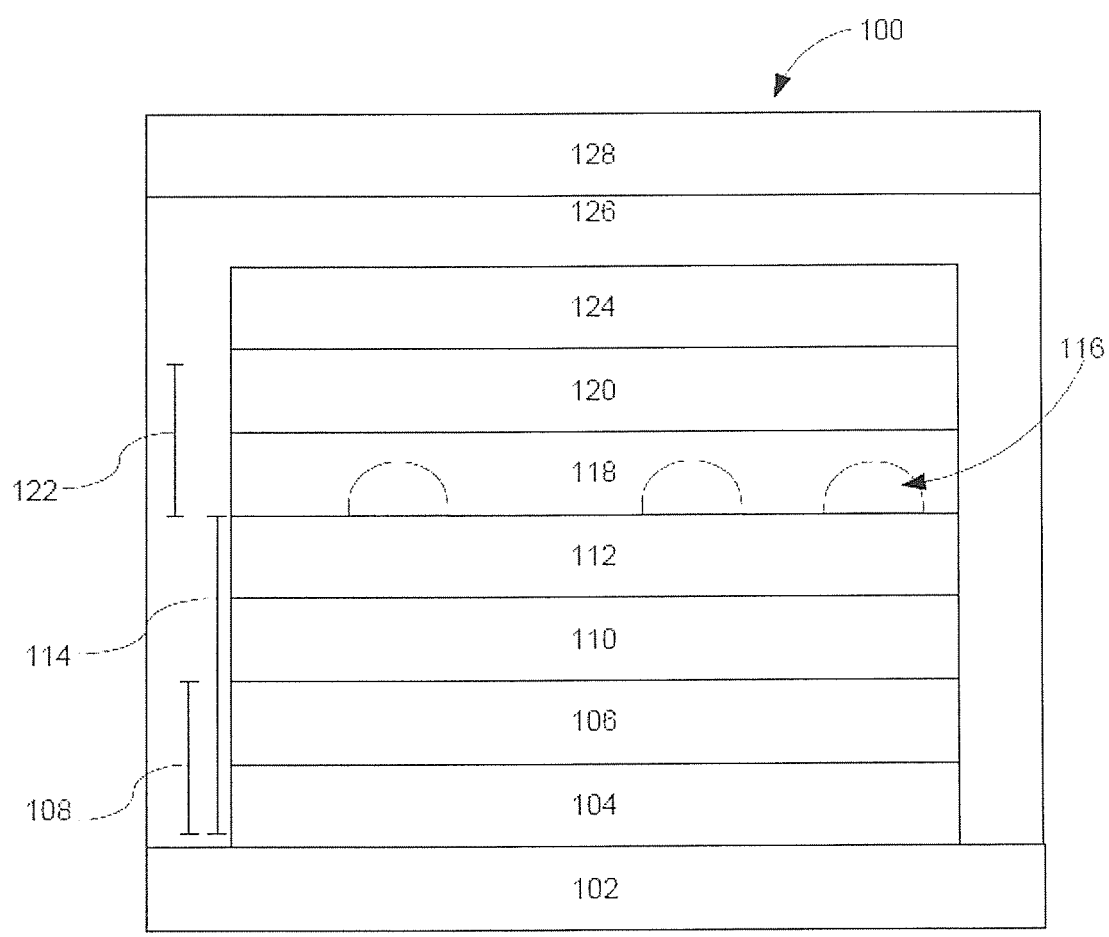
FIG. 1 shows a portion of a PV device in accordance with a disclosed embodiment.

Since light has to pass through the window layer to be converted to electricity, it is desirable to have a thin window layer which allows light to pass therethrough to the absorber layer. The more light that passes through the window layer, the more efficient the device. Thus, one method the included embodiments use to increase device photo-conversion efficiency is to use a window layer that is thin, dis-continuous, or even absent.

Another method the included embodiments use to enhance device photo-conversion efficiency is to reduce defect areas. Specifically, one factor that may limit thin-film photo-conversion efficiency is the number of photo-generated electron-hole pairs (i.e., carriers) that are trapped and then recombined before they are output as electricity by the device. In some instances, carriers may get trapped at structural defects such as defective grain or surface boundaries within or between various layers of the device.

For example, the semiconductor absorber layer is formed of grains, also known as crystallites. Crystallites are small, microscopic crystals, where the orientation of the crystal lattice within the crystallite is the same. But, a defect exists where the orientation of the crystal lattice changes from one grain to another. Hence, the crystallites that make up the absorber layer may be said to have defective grain boundaries where crystallites on each side of the boundary are identical, except in crystal orientation. Similarly, defects, such as surface defects, may also occur at interfaces between materials due to lattice mismatch. That is, each material has a different distance between unit cells in its crystal lattice.

In any case, the larger the grains that make up the absorber layer, the lesser the number of grain boundary defects present in the absorber layer. Similarly, the smaller the lattice mismatch between interface materials of the enclosed PV device embodiments, the lesser the number of surface defects. The fewer the defects in the enclosed PV device embodiments, the higher the conversion efficiency due to fewer electron-hole recombinations which can occur at defect locations.

One method of decreasing the number of defects in the enclosed embodiments is to subject the absorber layer to a cadmium chloride ($CdCl_2$) activation treatment. Alternative compounds for the activation treatment can also be used such as, for example, $NHCl_2$, $ZnCl_2$, $TeCl_2$, or other halide salts. The $CdCl_2$ activation treatment increases the size of the grains or crystals that make up the absorber layer and thus reduces the number of grain boundaries available to trap carriers. Device efficiency may thus be enhanced.

For example, a thin-film PV device may have a window layer formed of cadmium sulfide (CdS) and an absorber layer formed of cadmium telluride (CdTe). The $CdCl_2$ activation treatment includes applying $CdCl_2$, for example, in liquid or vapor form, to the CdTe of the absorber layer, and then annealing the absorber layer at a particular anneal temperature, for example between about 400° C. to about 450° C., for a particular anneal time, for example, from about 5 minutes to about one hour. The anneal temperature is generally high enough and the anneal time long enough to promote recrystallization of the CdTe crystallites.

The recrystallization of the CdTe material can take two forms or a combination of the following two forms: (1) intragrain or primary recrystallization (recrystallization that changes crystallite grain orientation); and (2) intergrain, or secondary recrystallization (recrystallization resulting from grain coalescence).

The primary crystallization leads to adjacent grains, which were oriented differently, to now be oriented in the same direction. Hence, primary crystallization results in a lesser number of defective boundaries being available to trap carriers therein. By contrast, the secondary recrystallization results in grain growth as smaller grains coalesce into larger ones. Thus, it too, leads to a reduced number of grain boundaries, which could contain defects.

Further, in addition to reducing the number of defective grain boundaries in the absorber layer, the $CdCl_2$ activation treatment also repairs some of the defects in the grain and surface boundaries. This is done through the incorporation of chlorine atoms (or ions) from the $CdCl_2$ into the CdTe absorber layer. Other mechanisms believed to repair or passivate such defects include the formation of doping complexes within the absorber layer created by cadmium vacancies, the incorporation of chlorine atoms to occupy tellurium sites, and inter-diffusion of materials between the absorber layer and the semiconductor window layer.

The $CdCl_2$ and the heat from the $CdCl_2$ annealing, while being beneficial in reducing the number of defective grain boundaries in the absorber layer may also promote chemical fluxing. Fluxing occurs when a chemical element from one layer of a photovoltaic device, where it is in high concentration, flows into another layer where there is a low concentration, or where it is not.

In this case, the $CdCl_2$ activation treatment may increase the mobility of sulfur atoms from a CdS window layer, overly thinning the layer, and in extreme situations, entirely removing it in some areas where the p-n junction is degraded or lost. The degradation of the absorber-window p-n junction is generally thought to be undesirable. Some PV devices use thicker window layers to prevent loss of p-n junctions during $CdCl_2$ activation treatment, however this too is undesirable because the thicker window layer prevents more light from reaching the absorber layer.

Thus, various disclosed embodiments incorporate a deposited $CdS_xTe_{1-x}$ material (where x is greater than zero and less than one), which is an alloy of cadmium (Cd), sulfur (S), and tellurium (Te), to allow PV device configurations which: allow more incident photons to reach the absorber layer; control fluxing of the window layer to allow for more aggressive halide salt, i.e. $CdCl_2$, activation treatment; passivate other defects including surface defects; and/or are less complicated or require less materials to produce.

For illustrative purposes, embodiments are described below with reference to a thin film PV device. However, it should be understood that the embodiments may apply to PV devices other than thin film PV devices.

A photovoltaic device according to one example of the invention can include an absorber layer, a non-continuous window layer, and a $CdS_xTe_{1-x}$ layer between the non-continuous window layer and the absorber layer, where x is greater than 0 and less than 1. In another aspect of the invention, the photovoltaic device can be configured wherein x in the $CdSxTe_{1-x}$ is between about 0.01 and about 0.3, or for example, wherein x is between about 0.01 and about 0.15, or for example wherein x is between about 0.02 and about 0.10. In one example of the invention the photovoltaic device non-continuous window layer can comprise discontinuous segments of CdS material. In another example of the invention, the photovoltaic device absorber layer can comprise CdTe. In yet another example of the invention, the non-continuous window layer can be configured to have an average segment thickness of greater than 0 nm and up to about 50 nm.

In another example, a $CdS_xTe_{1-x}$ layer can have a thickness of about 30 nm to about 1000 nm, or have a thickness of about 400 nm to about 600 nm. In another example, the photovoltaic device can be configured to have and absorber layer with a thickness from about 1000 nm to about 8000 nm. In one aspect of the invention, a non-continuous window layer comprises CdS segments which have an average thickness of less than about 50 nm, a $CdS_xTe_{1-x}$ layer has a thickness in the range of about 30 nm to about 1000 nm, and an absorber layer comprises CdTe and has a thickness in the range of about 1000 nm to about 8000 nm. In another aspect of the invention the photovoltaic device can further comprise a first electrode and a buffer layer between the first electrode and the non-continuous window layer. In one example, the buffer layer comprises an n-type semiconductor material. In another example, the buffer layer can comprise at least one of a material selected from the group consisting of: $SnO_2$ and ZnO.

In another aspect of the invention, a $CdS_xTe_{1-x}$ layer can have a sulfur concentration gradient over its thickness such that a concentration of sulfur is greater at portions closest to a non-continuous window layer than at portions closest to the absorber layer. In another aspect of the invention, a $CdS_xTe_{1-x}$ layer comprises a first sub-layer adjacent a non-continuous window layer and a second sub-layer adjacent the first sub-layer. In one example, the first sub-layer has a higher sulfur concentration than the second sub-layer. In one aspect of the invention, at least one of a first and a second sub-layers has a consistent sulfur content over its thickness. In another aspect of the invention at least one of a first sub-layer and a second sub-layer has a graded sulfur content over its thickness. In another example, each of the first and second sub-layers has a thickness of greater than 0 nm and less than or equal to about 500 nm.

A photovoltaic device, according to an example of the invention can include a semiconductor absorber layer, a semiconductor window layer on a first side of the semiconductor absorber layer, and a $CdS_xTe_{1-x}$ layer on a second side of the semiconductor absorber layer, wherein x is greater than 0 and less than 1. In another aspect of the invention, the photovoltaic device can be configured wherein x in the $CdSxTe_{1-x}$ is between about 0.01 and about 0.3, or for example, wherein x is between about 0.01 and about 0.15, or for example wherein x is between about 0.02 and about 0.10. In another aspect of the invention a $CdS_xTe_{1-x}$ layer can be configured to be about 50 nm to about 1000 nm thick. In another aspect of the invention the semiconductor window layer is about 0 nm to about 100 nm thick. In a further aspect of the invention, the semiconductor absorber layer comprises sulfur provided by the $CdS_xTe_{1-x}$ layer. In one example, the $CdS_xTe_{1-x}$ layer is a copper-doped $CdS_xTe_{1-x}$ layer. In one aspect of the invention a copper-doped $CdS_xTe_{1-x}$ layer comprises about 1 ppm copper to about 50 ppm copper.

A photovoltaic device according to an example of the invention can include a semiconductor window layer, a semiconductor absorber layer adjacent to the semiconductor window layer, and a $CdS_xTe_{1-x}$ layer within the semiconductor absorber layer, wherein x is greater than 0 and less than 1. In one aspect of the invention, the photovoltaic device can be configured wherein x in the $CdSxTe_{1-x}$ is between about 0.01 and about 0.3, or for example, wherein x is between about 0.01 and about 0.15, or for example wherein x is between about 0.02 and about 0.10. In one aspect of the invention the $CdS_xTe_{1-x}$ layer can be about 50 nm to about 1000 nm thick. In another aspect of the invention the semiconductor absorber layer comprises sulfur provided by the $CdS_xTe_{1-x}$ layer. In yet another aspect of the invention the $CdS_xTe_{1-x}$ layer is a copper-doped $CdS_xTe_{1-x}$ layer. In one example, the copper-doped $CdS_xTe_{1-x}$ layer comprises about 1 ppm copper to about 50 ppm copper.

A photovoltaic device according to another example of the invention includes a semiconductor absorber layer, a semiconductor window layer on a first side of the semiconductor absorber layer, a first $CdS_xTe_{1-x}$ layer on the first side of the semiconductor absorber layer and between the semiconductor window layer and the semiconductor absorber layer, and a second $CdS_xTe_{1-x}$ layer on a second side of the semiconductor absorber layer, wherein x in each of the first and second $CdS_xTe_{1-x}$ is independently greater than 0 and less than 1. In one aspect of the invention x is can be between about 0.01 to about 0.30 in at least one of the first $CdS_xTe_{1-x}$ layer and the second $CdS_xTe_{1-x}$ layer. In another aspect of the invention wherein x is between about 0.01 to about 0.15 in at least one of the first $CdS_xTe_{1-x}$ layer and the second $CdS_xTe_{1-x}$ layer. In yet another aspect of the invention, x is between about 0.02 to about 0.10 in at least one of the first $CdS_xTe_{1-x}$ layer and the second $CdS_xTe_{1-x}$ layer.

In one configuration, at least one of the first $CdS_xTe_{1-x}$ layer and the second $CdS_xTe_{1-x}$ layer is about 50 nm to about 1000 nm thick. In one aspect of the invention the semiconductor absorber layer comprises sulfur provided by at least one of the first $CdS_xTe_{1-x}$ layer and the second $CdS_xTe_{1-x}$ layer. In another aspect of the invention at least one of the first $CdS_xTe_{1-x}$ layer and the second $CdS_xTe_{1-x}$ layer is a copper-doped $CdS_xTe_{1-x}$ layer. In one configuration the copper-doped $CdS_xTe_{1-x}$ layer comprises about 1 ppm copper to about 50 ppm copper.

A photovoltaic device according to another example of the invention includes a buffer layer, a semiconductor absorber layer, and a $CdS_xTe_{1-x}$ layer between the buffer layer and the semiconductor absorber layer, wherein x is greater than 0 and less than 1, and wherein the photovoltaic device does not include a window layer. In one aspect of the invention x is can be between about 0.01 to about 0.30 in at least one of the first $CdS_xTe_{1-x}$ layer and the second $CdS_xTe_{1-x}$ layer. In another aspect of the invention wherein x is between about 0.01 to about 0.15 in at least one of the first $CdS_xTe_{1-x}$ layer and the second $CdS_xTe_{1-x}$ layer. In yet another aspect of the invention, x is between about 0.02 to about 0.10. In one configuration, the $CdS_xTe_{1-x}$ layer is about 200 nm to about 1000 nm thick. In one example, the semiconductor absorber layer comprises sulfur provided by the $CdS_xTe_{1-x}$ layer. In one aspect of the invention the $CdS_xTe_{1-x}$ layer is a copper-doped $CdS_xTe_{1-x}$ layer. In yet another aspect of the invention, the copper-doped $CdS_xTe_{1-x}$ layer comprises about 1 ppm copper to about 50 ppm copper. In yet another aspect of the invention the photovoltaic device includes an additional sulfur-containing layer.

In one configuration of the photovoltaic device, the additional sulfur-containing layer is positioned between the $CdS_xTe_{1-x}$ layer and the semiconductor absorber layer. In one aspect of the invention, the additional sulfur-containing layer is positioned within the semiconductor absorber layer. In yet another aspect of the invention the additional sulfur-containing layer is positioned between the semiconductor absorber layer and a back contact. In yet another aspect of the invention, x is between about 0.05 and 0.5.

Furthermore, in another example, the additional sulfur-containing layer comprises a material selected from the group consisting of a $CdS_{x2}Te_{1-x2}$ material (where $x^2<x$), CdS, ZnS and $ZnO_xS_y$.

A photovoltaic device according to another example of the invention includes a buffer layer over a front contact and a $CdS_xTe_{1-x}$ layer between the buffer layer and a back contact, wherein x is greater than 0 and less than 1, and wherein the photovoltaic device does not include a separate semiconductor absorber layer or a separate semiconductor window layer. In another aspect of the invention, the $CdS_xTe_{1-x}$ layer functions as an absorber layer. In yet another aspect of the invention, x can be between about 0.01 to about 0.30. In another example, x is between about 0.01 to about 0.15. And in another example, x is between about 0.02 to about 0.10. According to one aspect of the invention x is substantially constant over an entire thickness of the $CdS_xTe_{1-x}$ layer. In another aspect of the invention x changes over a thickness of the $CdS_xTe_{1-x}$ layer such that x is larger where the $CdS_xTe_{1-x}$ layer is nearer the front contact and x is smaller where the $CdS_xTe_{1-x}$ layer is nearer the back contact. And in another aspect of the invention, the $CdS_xTe_{1-x}$ layer is graded in sulfur and tellurium content over a thickness of the $CdS_xTe_{1-x}$ layer in a step-wise fashion. In yet another aspect of the invention the $CdS_xTe_{1-x}$ layer is graded in sulfur and tellurium content over a thickness of the $CdS_xTe_{1-x}$ layer in a gradual fashion.

In one aspect of the invention the $CdS_xTe_{1-x}$ layer can be about 2 μm to about 8 μm thick. In another aspect of the invention the $CdS_xTe_{1-x}$ layer is a copper-doped $CdS_xTe_{1-x}$ layer. In one configuration, the copper-doped $CdS_xTe_{1-x}$ layer comprises about 1 ppm copper to about 50 ppm copper.

One of the methods of forming a photovoltaic device includes forming a first contact layer, forming a semiconductor window layer over the first contact layer, forming a semiconductor absorber layer over the semiconductor window layer, forming a $CdS_xTe_{1-x}$ layer over the semiconductor absorber layer, wherein x is greater than 0 and less than 1, and forming a second contact layer over the $CdS_xTe_{1-x}$ layer. In one aspect of the method, x is between about 0.01 to about 0.30. In another aspect, x is between about 0.01 to about 0.15. And in yet another aspect of the method, x is between about 0.02 to about 0.10.

In one particular embodiment, the $CdS_xTe_{1-x}$ layer is about 50 nm to about 1000 nm thick. In one aspect of the method, the semiconductor absorber layer comprises sulfur provided by the $CdS_xTe_{1-x}$ layer. In one example, the method can include performing an activation step including annealing the semiconductor window layer, semiconductor absorber layer, and $CdS_xTe_{1-x}$ layer in the presence of $CdCl_2$. In one example, the $CdS_xTe_{1-x}$ layer maintains an interface between the semiconductor window layer and the semiconductor absorber layer during the activation step. The method can further include doping the $CdS_xTe_{1-x}$ layer with about 1 ppm copper to about 50 ppm copper.

A method of forming a photovoltaic device according to another example of the invention includes forming a first contact layer, forming a semiconductor window layer over the first contact layer, forming a portion of a semiconductor absorber layer over the semiconductor window layer, forming a $CdS_xTe_{1-x}$ layer over the portion of the semiconductor absorber layer, wherein x is greater than 0 and less than 1, forming a remainder of the semiconductor absorber layer, and forming a second contact layer over the semiconductor absorber layer. In one aspect of the method, x is between about 0.01 to about 0.30. In another aspect of the invention x is between about 0.01 to about 0.15. In yet another aspect of the invention x is between about 0.02 to about 0.10. In one particular embodiment the $CdS_xTe_{1-x}$ layer is formed to about 50 nm to about 1000 nm thick. In one section of the invention, the semiconductor absorber layer comprises sulfur provided by the $CdS_xTe_{1-x}$ layer.

The method can further include performing an activation step including annealing the semiconductor window layer, semiconductor absorber layer, and $CdS_xTe_{1-x}$ layer in the presence of $CdCl_2$. In one aspect of the invention the $CdS_xTe_{1-x}$ layer maintains an interface between the semiconductor window layer and the semiconductor absorber layer during the activation step. The method can also include doping the $CdS_xTe_{1-x}$ layer with about 1 ppm copper to about 50 ppm copper.

A method of forming a photovoltaic device according to another example of the invention includes forming a first contact layer, &tuning a semiconductor window layer over the first contact layer, forming a first $CdS_xTe_{1-x}$ layer over the semiconductor window layer, forming a semiconductor absorber layer over the first $CdS_xTe_{1-x}$ layer, forming a second $CdS_xTe_{1-x}$ layer over the semiconductor absorber layer, wherein x in each of the first and second $CdS_xTe_{1-x}$ is independently greater than 0 and less than 1, and forming a second contact layer over the second $CdS_xTe_{1-x}$ layer. In one aspect of the method x is between about 0.01 to about 0.30 in at least one of the first $CdS_xTe_{1-x}$ layer and the second $CdS_xTe_{1-x}$ layer. In another aspect of the method, x is between about 0.01 to about 0.15 in at least one of the first $CdS_xTe_{1-x}$ layer and the second $CdS_xTe_{1-x}$ layer. In yet another aspect of the method, x is between about 0.02 to about 0.10 in at least one of the first $CdS_xTe_{1-x}$ layer and the second $CdS_xTe_{1-x}$ layer.

In one example embodiment, at least one of the first $CdS_xTe_{1-x}$ layer and the second $CdS_xTe_{1-x}$ layer is about 50 nm to about 1000 nm thick. In one aspect of the method the semiconductor absorber layer comprises sulfur provided by at least one of the first $CdS_xTe_{1-x}$ layer and the second $CdS_xTe_{1-x}$ layer. In another aspect of the inventive method, the method further includes performing an activation step including annealing the semiconductor window layer, semiconductor absorber layer, and at least one of the first $CdS_xTe_{1-x}$ layer and second $CdS_xTe_{1-x}$ layer in the presence of $CdCl_2$. The method can be performed such that at least one of the first $CdS_xTe_{1-x}$ layer and the second $CdS_xTe_{1-x}$ layer maintains an interface between the semiconductor window layer and the semiconductor absorber layer during the activation step. In one aspect of the method, the method includes doping at least one of the first $CdS_xTe_{1-x}$ layer and the second $CdS_xTe_{1-x}$ layer with about 1 ppm copper to about 50 ppm copper.

A method of forming a photovoltaic device according to another example of the invention includes forming a first contact layer, forming a buffer layer over the first contact layer, forming a $CdS_xTe_{1-x}$ layer over the buffer layer, wherein x is greater than 0 and less than 1, and wherein no separate semiconductor window layer is formed, forming a semiconductor absorber layer over the $CdS_xTe_{1-x}$ layer, and forming a second contact layer over the semiconductor absorber layer. In one aspect of the method x is between about 0.01 to about 0.30. In another aspect of the method, x is between about 0.01 to about 0.15. In yet another aspect of the method x is between about 0.02 to about 0.10. In one particular embodiment the $CdS_xTe_{1-x}$ layer is about 50 nm to about 1000 nm thick. In one aspect of the method the semiconductor absorber layer comprises sulfur provided by the $CdS_xTe_{1-x}$ layer.

In one example of the method can include performing an activation step including annealing the semiconductor absorber layer and $CdS_xTe_{1-x}$ layer in the presence of $CdCl_2$. The method can also include doping the $CdS_xTe_{1-x}$ layer with about 1 ppm copper to about 50 ppm copper. In one aspect of the invention, the method can include forming an additional sulfur-containing layer. In another aspect of the invention, the additional sulfur-containing layer is positioned between the $CdS_xTe_{1-x}$ layer and the semiconductor absorber layer. In yet another aspect of the invention the additional sulfur-containing layer is positioned within the semiconductor absorber layer. In yet another aspect of the invention the additional sulfur-containing layer is positioned between the semiconductor absorber layer and a back contact. In one particular example, x is between about 0.05 and 0.5. In one aspect of the invention the additional sulfur-containing layer comprises a material selected from the group consisting of a $CdS_{x2}Te_{1-x2}$ material (where $x_2<x$), CdS, ZnS and $ZnO_xS_y$.

A method of forming a photovoltaic device according to another example of the invention includes forming a first contact layer, forming a buffer layer over the first contact layer, forming a $CdS_xTe_{1-x}$ layer over the buffer layer, wherein x is greater than 0 and less than 1, and forming a second contact layer over the $CdS_xTe_{1-x}$ layer, wherein no CdS window layer and no CdTe absorber layer are provided. In one aspect of the invention, the $CdS_xTe_{1-x}$ layer functions as an absorber layer. In one particular example, x is between about 0.01 to about 0.30. In another example, x is between about 0.01 to about 0.15. And in yet another example, x is between about 0.02 to about 0.10.

In one aspect of the invention x is substantially constant over an entire thickness of the $CdS_xTe_{1-x}$ layer. In another aspect of the invention x changes over a thickness of the $CdS_xTe_{1-x}$ layer such that x is larger where the $CdS_xTe_{1-x}$ layer is nearer the first contact and x is smaller where the $CdS_xTe_{1-x}$ layer is nearer the second contact. In another aspect of the invention, the $CdS_xTe_{1-x}$ layer is graded in sulfur and tellurium content over a thickness of the $CdS_xTe_{1-x}$ layer in a step-wise fashion. And in yet another aspect of the invention, the $CdS_xTe_{1-x}$ layer is graded in sulfur and tellurium content over a thickness of the $CdS_xTe_{1-x}$ layer in a gradual fashion. In one particular embodiment, the $CdS_xTe_{1-x}$ layer is about 2 μm to about 8 μm thick. The method can include doping the $CdS_xTe_{1-x}$ layer with about 1 ppm copper to about 50 ppm copper.

A method of forming a photovoltaic device according to another example of the invention includes depositing a $CdS_xTe_{1-x}$ layer over a TCO stack deposited on a substrate, wherein x is greater than 0 and less than 1, and depositing a semiconductor absorber layer over the $CdS_xTe_{1-x}$ layer, wherein the $CdS_xTe_{1-x}$ layer and the semiconductor absorber layer are deposited using a VTD coater, and wherein the VTD coater has heater temperature settings such that a conveyance zone prior to a first distribution zone in which the $CdS_xTe_{1-x}$ layer is deposited, relative to a direction of movement of the substrate, has a higher temperature at a center of the conveyance zone and a lower temperature at sides of the conveyance zone. In one aspect of the method, the VTD coater has heater temperature settings such that a pre-heat zone located prior to the conveyance zone, relative to the direction of movement of the substrate, has a higher temperature at a center of the pre-heat zone and a lower temperature at sides of the pre-heat zone. In another aspect of the invention, the temperature at the center of the conveyance zone is about 600° C. and the temperature at the sides of the conveyance zone is about 510° C., and wherein the temperature at the center of the pre-heat zone is about 625° C. and the temperature at the sides of the pre-heat zone is about 535° C. In another aspect of the invention, a temperature at sides of the first distribution zone is about 640° C. and a temperature at a center of the first distribution zone is about 610° C.

In one particular example of the method, the absorber layer is deposited at a second distribution zone, located after the first distribution zone, and wherein a temperature at sides of the second distribution zone is about 640° C. and a temperature at a center of the second distribution zone is about 610° C. In another example, the method can include depositing a semiconductor window layer over the TCO stack before depositing the $CdS_xTe_{1-x}$ layer, wherein the semiconductor window layer is deposited in a third distribution zone of the coater located between first zone and the first distribution zone, and wherein a temperature of the third distribution zone is about 600° C. In one particular aspect of the invention the VTD coater further has heater temperature settings such that the temperature at the sides of the pre-heat zone is varied, along the direction of movement of the substrate. In another aspect of the invention the temperature at the sides of the pre-heat zone is varied, along the direction of movement of the substrate, to be about 525° C., about 575° C., about 650° C., and about 675° C., in order, and the temperature at the center of the pre-heat zone is about 650° C.

The inventive method can include depositing a semiconductor window layer over the TCO stack before depositing the $CdS_xTe_{1-x}$ layer, wherein the semiconductor window layer is deposited in a second distribution zone of the coater located between the pre-heat zone and first zone of the coater. In one particular aspect of the invention, the VTD coater further has heater temperature settings such that the temperature at the center of the conveyance zone is varied, along the direction of movement of the substrate. On another aspect of the invention the temperature at the center of the conveyance zone is varied, along the direction of movement of the substrate, to be about 560° C., about 590° C., about 650° C., and about 600° C., in order, and the temperatures at the sides of the conveyance zone are about 550° C. In one particular example, a temperature at the second distribution zone is about 600° C. In another example, the temperature at the first distribution zone is about 600° C. In one aspect of the invention, the absorber layer is deposited at a third distribution zone, located after the first distribution zone of the coater, and wherein a temperature at sides of the third distribution zone is about 630° C. and a at a center of the third distribution zone is about 600° C. In another aspect of the invention, the method can include a fourth distribution zone, wherein the absorber layer is deposited at both the third and fourth distribution zones, and wherein a temperature at sides of the fourth distribution zone is about 630° C. and a at a center of the fourth distribution zone is about 600° C.

A method of forming a photovoltaic device according to another example of the invention includes forming a non-continuous window layer, forming an absorber layer; and forming a $CdS_xTe_{1-x}$ layer between the non-continuous window layer and the absorber layer, where x is greater than 0 and less than 1. In one aspect of the invention, forming a non-continuous window layer includes forming a continuous window and transforming the continuous window layer into the non-continuous window layer. In another aspect of the invention the continuous window layer is formed before forming the $CdS_xTe_{1-x}$ layer and the absorber layer and the transforming occurs after forming the $CdS_xTe_{1-x}$ layer and the absorber layer.

In one example of the method, the continuous window layer contains sulfur and the transforming the continuous window layer into a non-continuous window layer comprises subjecting the continuous window layer to a thermal anneal sufficient to flux sulfur out of the sulfur containing continuous window layer and break the continuous window layer into segments of window layer material. In one aspect of the invention the thermal anneal is associated with at least one absorber layer chlorine activation step. In yet another aspect of the invention the at least one absorber layer chlorine activation step comprises a first activation step at a first predetermined temperature and a second activation step at a second predetermined temperature.

In one example of the method, the at least one chlorine activation step is performed in a temperature range of about 350° C. to about 500° C. In one aspect of the invention, the first and second predetermined temperatures are different. In another aspect of the invention the first chlorine activation step comprises applying $CdCl_2$ to the absorber layer and annealing at about 400° C.-450° C. for about 15 minutes and the second chlorine activation step comprises annealing at about 430° C.-450° C. for about 15 minutes.

In one aspect of the invention, the value of x is between about 0.01 and about 0.3. In another aspect of the invention, the $CdS_xTe_{1-x}$ layer is formed to a thickness of about 30 nm to about 1000 nm. In yet another aspect of the invention the $CdS_xTe_{1-x}$ layer is formed to a thickness of about 400 nm to about 600 nm. In another aspect of the invention the non-continuous window layer comprises segments and has an average segment thickness of greater than 0 nm and up to about 50 nm. And in yet another aspect of the invention the absorber layer is formed to a thickness of about 1000 nm to about 8000 nm.

In one particular example of the method, the non-continuous window layer comprises CdS segments having an average thickness of greater than 0 nm to about 50 nm, the $CdS_xTe_{1-x}$ layer has a thickness in the range of about 30 nm to about 1000 nm, and the absorber layer comprises CdTe and has a thickness in the range of about 1000 nm to about 8000 nm. In one aspect of the invention, the method of claim 1, further comprising forming a first electrode and a buffer layer wherein the buffer layer is formed between the first electrode and the non-continuous window layer. In another aspect of the invention, the buffer layer comprises an n-type semiconductor material. And in yet another aspect of the invention the buffer layer comprises at least one of a material selected from the group consisting of: $SnO_2$ and ZnO.

In one particular example of the method, the $CdS_xTe_{1-x}$ layer is formed having a sulfur concentration gradient over its thickness such that the concentration of sulfur is greater at portions closest to the non-continuous window layer than at portions closest to the absorber layer. In one aspect of the invention the $CdS_xTe_{1-x}$ layer is formed comprising a first sub-layer adjacent the non-continuous window layer and a second sub-layer adjacent the first sub-layer. In another aspect of the invention the first sub-layer is formed having a higher sulfur concentration than the second sub-layer.

In one aspect of the invention at least one of the first and the second sub-layers are formed having a consistent sulfur content over its thickness. In another aspect of the invention at least one of the first sub-layer and the second sub-layer is formed having a graded sulfur content over its thickness. In yet another aspect of the invention each of the first and second sub-layers is formed to a thickness of greater than 0 nm and less than or equal to about 500 nm.

Now referring to the accompanying figures, wherein like reference numbers denote like features, FIG. 1 illustrates one example embodiment of a PV device 100 which includes a semiconductor multi-layer structure 122 provided over a transparent conductive oxide (TCO) stack 114 which is in turn provided over a substrate 102. The substrate 102 provides an outer planar surface which is used to protect the PV device 100 from environmental hazards. Since the substrate 102 receives light incident on the PV device 100, it should be made of a transparent material. In this case, glass or any other suitable material may be used, such as borosilicate glass, soda lime glass, float glass, or a polymer.

TCO stack 114 includes an optional barrier layer 108, TCO layer 110 and optional buffer layer 112. The TCO stack 114 may be pre-formed on substrate. Alternatively, the TCO stack 114 may be formed one layer at a time over substrate 102 during fabrication of device 100. In any case, the barrier layer 108 is used to inhibit sodium diffusion from the substrate 102 into other layers (i.e., the window and absorber layers) of the device. Sodium diffusion into these layers may adversely affect device efficiency. The barrier layer 108 can be a bi-layer of an $SnO_2$ layer 104 over the substrate 102 and an $SiO_2$ layer 106 over the $SnO_2$ layer 104 or a single layer of $SiO_2$ or $SnO_2$.

The TCO layer 110 functions as one of the two output electrodes of the device. Since light has to pass through the TCO layer 110 to reach the semiconductor layers where it is converted to electricity, it may be made of a transparent conductive material such as indium tin oxide (ITO), fluorine doped tin oxide ($SnO_2$:F), or cadmium stannate ($Cd_2SnO_4$). The buffer layer 112 may be used to reduce electron-hole recombination at the TCO layer 110 semiconductor multi-layer structure 122 interface. The buffer layer 112 may be made of a metal oxide such as $SnO_2$, ZnO, or a combination of ZnO and $SnO_2$. The semiconductor multi-layer 122 includes a non-continuous n-type window layer 116, a $CdS_xTe_{1-x}$ layer 118, and a p-type absorber layer 120. Those layers are described in more detail below.

The non-continuous window layer 116 is formed adjacent to TCO stack 114. The non-continuous window layer 116 is preferably formed of Cadmium Sulfide. Although the CdS window layer 116 is shown as being discontinuous in FIG. 1 it should be noted that it may be initially deposited as a continuous CdS layer and may be made discontinuous during further PV device processing after layers 116, 118 and 120 are formed, as described in detail below.

The layer 118 is formed of $CdS_xTe_{1-x}$, where x is greater than zero and less than one, but is preferably about 0.01 to about 0.3, meaning that the atomic ratio of sulfur to total anion (i.e., tellurium plus sulfur) in the alloy material can be between about 1% to about 30% sulfur with the balance (e.g., about 99% to about 70%) being tellurium. Note, the atomic ratio of concern in the $CdS_xTe_{1-x}$ material is that of the sulfur and tellurium and the cadmium content is not dependent on this atomic ratio, as indicated by the formula above. The range of sulfur incorporation in the $CdS_xTe_{1-x}$ layer 118 is set with the understanding that increasing the amount of sulfur that can be incorporated into a CdTe material can lower the band gap of the CdTe while keeping the CdTe p-type, which is important for the p-n junction. Band gap is the energy required to excite electrons from the valence band to the conduction band, to become a mobile charge carrier and determines what portion of the solar spectrum the absorber layer absorbs and photons can be harvested. For example, the optical band gap ($E_g$) of CdTe is about 1.55 eV, but this optical band gap is lowered as sulfur is introduced to the CdTe material to form $CdS_xTe_{1-x}$. Where x is up to about 0.3, the optical band gap of the absorber layer 120 material can be reduced to about 1.4 eV. Lowering the band gap of the CdTe layer 120 allows photons of a higher wavelength to be harvested. A point can be reached when adding sulfur to the CdTe material where the CdTe can become n-type, which is undesirable if a p-n junction is to be maintained for photoconversion. The atomic ratio range of up to about 30% sulfur (relative to tellurium plus sulfur) falls safely within an amount of sulfur that can modify the band gap of CdTe, but not convert it to n-type. The $CdS_xTe_{1-x}$ layer 118 can also be alloyed or doped with other elements, including but not limited to Na, Mg, Zn, Cu, S, Se, Cu, O, and N.

Another preferred value for x is between about 0.01 to about 0.15, such that there is between about 1% and about 15% sulfur relative to total anion and about 99% to about 85% tellurium relative to total anion. This range has been experimentally determined to provide the desired benefits of the $CdS_xTe_{1-x}$ layer 118 (discussed below) without incurring potential structural defects in the $CdS_xTe_{1-x}$ layer 118, which may occur due to $CdCl_2$ activation treatment of the absorber layer 120, such as physical voids in the $CdS_xTe_{1-x}$ layer 118 caused by too much diffusion of sulfur therefrom into the absorber layer 120. Another preferred value for x is between about 0.02 to about 0.10, such that there is between about 2% and about 10% sulfur relative to total anion and about 98% to about 90% tellurium relative to total anion. This range is set based both on the theory that about 5% sulfur in the $CdS_xTe_{1-x}$ layer 118 provides the desired benefits of the $CdS_xTe_{1-x}$ layer 118 (discussed below) to the PV device and on the experimental determination that single digit percentages of sulfur in the $CdS_xTe_{1-x}$ layer 118 provided for diffusion to the CdTe material of the absorber layer 120 are beneficial.

The $CdS_xTe_{1-x}$ layer 118 can be between about 20 nm to about 1000 nm thick. For example, in a range of about 30 nm to about 1000 nm thick, or in a range of about 50 nm thick to about 500 nm thick. For example, in a range of about 200 nm to about 800 nm thick, about 300 nm to about 700 nm thick, about 400 nm to about 600 nm thick.

The CdTe absorber layer 120 is about 500-8000 nm thick, for example about 3300 nm thick. Typically, a PV device would have a continuous window layer that is about 75 nm to 200 nm thick. Because the various discontinuous segments of the non-continuous window layer 116 may have different thicknesses, it is convenient to describe the non-continuous window layer 116 by an average thickness, which is the average thickness of each of the segments of the non-continuous window layer 116. The average thickness of the non-continuous window layer in this preferred embodiment can be from greater than 0 nm up to about 200 nm. In one example, the average thickness is up to about 100 nm or up to about 50 nm.

A back contact layer 124, serving as a second electrode, may be formed over the absorber layer 120. The back contact layer 124 does not have a transparency requirement and thus may be made of a metal such as Mo, Al, Cu, Ag, Au, or a combination thereof. After the formation of the back contact layer 124, a polymer interlayer 126 may be formed before affixing a back cover 128. The interlayer 126 may be provided over the back contact layer 124 and sides of the layers (114, 122, and 124) of the PV device 100. It is used to supplement bonding between the different layers of the device 100 and to inhibit ingress of water or other contaminants into the device. It may be made of a polymer such as ethylene-vinyl acetate.

The layers of the PV device 100 may be formed using any known deposition technique or combination of techniques. For example, the layers can be formed by chemical vapor deposition (CVD), physical vapor deposition (PVD), chemical bath deposition (CBD), low pressure chemical vapor deposition, atmospheric pressure chemical vapor deposition, plasma-enhanced chemical vapor deposition, thermal chemical vapor deposition, DC or AC sputtering, spin-on deposition, spray-pyrolysis, vapor transport deposition (VTD), closed space sublimation (CSS), as some examples, or a combination thereof. These processes are well known in the industry and thus will not herein be described in detail. Although certain embodiments are described with respect to certain deposition techniques, the embodiments are not limited to such techniques.

In one example, the CdS window layer 116 is initially formed as a continuous CdS window layer using vaporized CdS powder, for example in a VTD process. Likewise, $CdS_xTe_{1-x}$ layer 118 can be formed over the continuous CdS window layer 116 using powdered CdTe as a source which is vaporized and with sulfur vapor being introduced with the CdTe vapor in the deposition zone to form a layer of $CdS_xTe_{1-x}$. The sulfur reacts with the CdTe being deposited to form $CdS_xTe_{1-x}$ layer 118. The $CdS_xTe_{1-x}$ layer 118 can also be formed using a mixture of CdS and CdTe powders which are vaporized, or using a pre-alloyed $CdS_xTe_{1-x}$ material which is vaporized, with preferred compositional amounts of Cd, S, and Te to provide a $CdS_xTe_{1-x}$ target with x in the desired range. The CdTe layer 120 can also be formed over the $CdS_xTe_{1-x}$ layer 118 using VTD where powdered CdTe is vaporized and deposited.

After the absorber layer 120 is deposited, a $CdCl_2$ activation treatment may ensue. As noted earlier, during the $CdCl_2$ activation treatment, the chlorine compound and the associated heat treatment increase sulfur mobility in the window layer 116 and, in the case of the present embodiment, in the $CdS_xTe_{1-x}$ layer 118 as well, causing the sulfur to be more easily fluxed, e.g. sulfur from the window layer dissolved into the $CdS_xTe_{1-x}$ layer 118 and sulfur from the $CdS_xTe_{1-x}$ and window layer dissolved into the absorber layer 120. By providing the $CdS_xTe_{1-x}$ layer 118 adjacent to the absorber layer 120, a source of sulfur is provided which decreases the sulfur gradient from window layer 116 to control the fluxing of the CdS of the window layer 116 during the $CdCl_2$ activation treatment. As a result, it is possible to use more aggressive $CdCl_2$ activation conditions to achieve an absorber layer 120 with a larger grain size without uncontrolled and complete sulfur consumption of the CdS window layer 116, and thus a destruction of the window layer. During the $CdCl_2$ activation, the $CdS_xTe_{1-x}$ layer 118 allows enough sulfur from the CdS window layer to flux out of the window layer to make it discontinuous, but not disappear.

An example of a more aggressive activation treatment which can provide a discontinuous CdS window layer 116 is provided in the following example. $CdCl_2$ is applied over the absorber layer 120 as an aqueous solution having a concentration of about 100-600 g/L. Other forms of $CdCl_2$ treatment may also be used, such as $CdCl_2$ vapor at ambient pressures. The anneal temperature can be up to about 700° C., which is 280-300 degrees hotter than typically used. For example, in a range of about 200° C. to about 700° C., about 300° C. to about 600° C., about 350° C. to about 500° C., about 400° C. to about 450° C., about 420° C. to about 450° C., or up to about 475° C.

The $CdCl_2$ activation treatment may include a single or a multiple pass anneal, meaning more than one heating step. One example of a multiple pass anneal uses a first heating of the $CdCl_2$ treated absorber layer 120 to between about 400° C. to about 450° C., for example about 450° C. for about 15 minutes and a second heating to between about 430° C. to about 450° C., for example about 450° C. for about 15 minutes. A second example of a multiple pass anneal uses a first heating to about 450° C. for about 15 minutes and a second heating to about 430° C. for about 20 minutes. A third example of a multiple pass anneal uses a first heating to about 430° C. for about 30 minutes and a second heating to about 430° C. for about 30 minutes. It is possible that, during the second heating steps just described, additional $CdCl_2$ can be applied to the absorber layer 120, if desired.

The annealing can be continued for as long as is needed to cause the CdS window layer to be partially but not completely consumed and form into a non-continuous window layer 116 structure such as that shown in FIG. 1. As examples, the $CdCl_2$ activation treatment can include an annealing for more than about 10 seconds, for example, in a range of about 10 seconds to about 2 hours, about 10 minutes to about 60 minutes, or about 15 minutes to about 30 minutes. The anneal time and temperature of each or either of the annealing conditions can be adjusted independently or together to achieve the non-continuous window layer 116 shown in FIG. 1. Longer anneal times and higher annealing temperatures are required for thicker initial CdS window layers, whereas lower anneal times and lower anneal temperatures can be used for thinner initial CdS window layers.

As described above, the consumption of the continuous CdS window layer is controlled because the sulfur containing $CdS_xTe_{1-x}$ layer 118 minimizes the sulfur concentration differential, the driving force, for fluxing of sulfur from the window layer 116. While FIG. 1 shows the discontinuous window layer 116 with segments of a particular shape, the segments can have any shape, such as semi-spherical, pebble-like, or irregular shapes, among other possible shapes.

The PV device 100 of FIG. 1 with a $CdS_xTe_{1-x}$ layer 118 and a non-continuous CdS window layer 116 has been found to have a higher photoconversion efficiency than a PV device with a continuous CdS window layer, or a non-continuous CdS window layer without a $CdS_xTe_{1-x}$ layer. Because the gaps in the non-continuous CdS window layer 116 are filled by the continuous $CdS_xTe_{1-x}$ layer 118 which behaves as part of the absorber layer, more photons can reach the absorber layer. In addition, the non-continuous CdS window layer 116 has areas where CdS is not present and is also thinner in average thickness than a conventional continuous window layer, which also allows more photons to pass through the non-continuous CdS window layer 116 to the $CdS_xTe_{1-x}$ and CdTe absorber layers 118 and 120.

As noted, the $CdS_xTe_{1-x}$ layer 118 is considered to be and behaves as a part of the absorber layer 120, particularly after the mixing of the $CdS_xTe_{1-x}$ material of the layer 118 and the CdTe material of the absorber layer 120 caused by the $CdCl_2$ activation anneal. It is believed that the gaps of non-continuous CdS window layer 116 where no CdS is present do not hinder photoconversion since the desired p-n junction is still provided by the junction between the buffer layer 112 (e.g., $SnO_2$ or ZnO, which are n-type materials) and the $CdS_xTe_{1-x}$ layer 118 (which is a p-type material).

Another advantage of providing the $CdS_xTe_{1-x}$ layer 118 in association with the absorber layer 120 is that the sulfur in the $CdS_xTe_{1-x}$ layer 118 can also serve to passivate the CdTe layer 120 and the CdS layer 116 surfaces and grain boundaries, respectively, in much the same way as Cl atoms from the $CdCl_2$ activation passivates the CdTe absorber layer. Passivation of the CdTe and CdS layers 120, 116 can reduce defects normally present at the absorber/window interface and those present at the absorber/$CdS_xTe_{1-x}$ interface. With less electron loss at grain boundaries and at surface interfaces, the PV device 100 photoconversion efficiency can increase.

Figure 2:
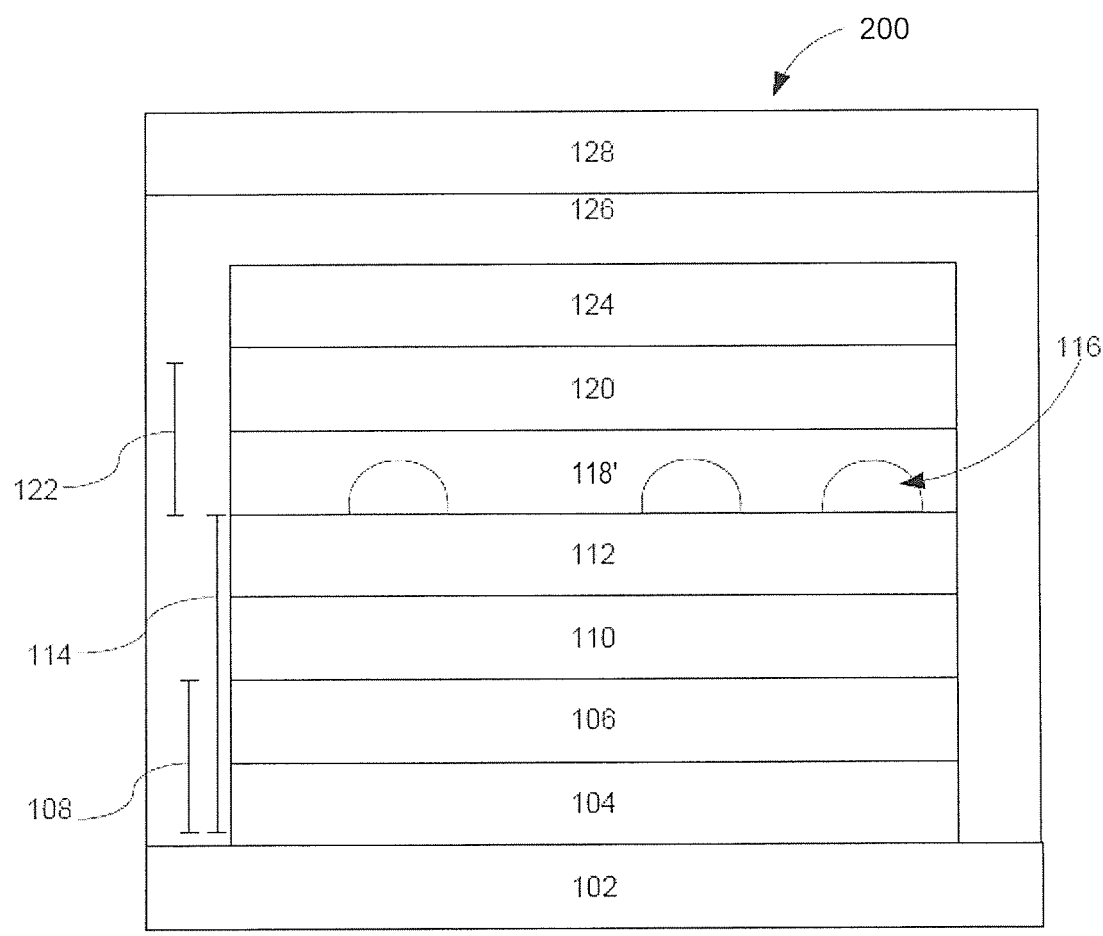
FIG. 2 shows a portion of a PV device in accordance with a disclosed embodiment.

FIG. 2 shows another example embodiment of a PV device 200 with similar layers (e.g., 102, 114, 116, 120, 122, 124, 126, 128) to those discussed above with reference to FIG. 1. These layers can be deposited in the same manner described above with reference to FIG. 1 and have the same thicknesses. However, FIG. 2 shows an alternative $CdS_xTe_{1-x}$ layer 118' to that shown in FIG. 1. Where in FIG. 1 the $CdS_xTe_{1-x}$ layer 118 has a uniform $CdS_xTe_{1-x}$ composition throughout its thickness (x remains constant), in the FIG. 2 embodiment the sulfur concentration is varied throughout $CdS_xTe_{1-x}$ layer 118'. The varied concentration is a graded composition in which more sulfur is present at a lowermost portion of layer 118' adjacent the CdS window layer 116 than at a highermost portion of layer 118' adjacent the CdTe absorber layer 120. In other words, the value x in the formula $CdS_xTe_{1-x}$ changes and is larger at the lowermost portion and smaller at the uppermost portion of layer 118'.

Figure 3:
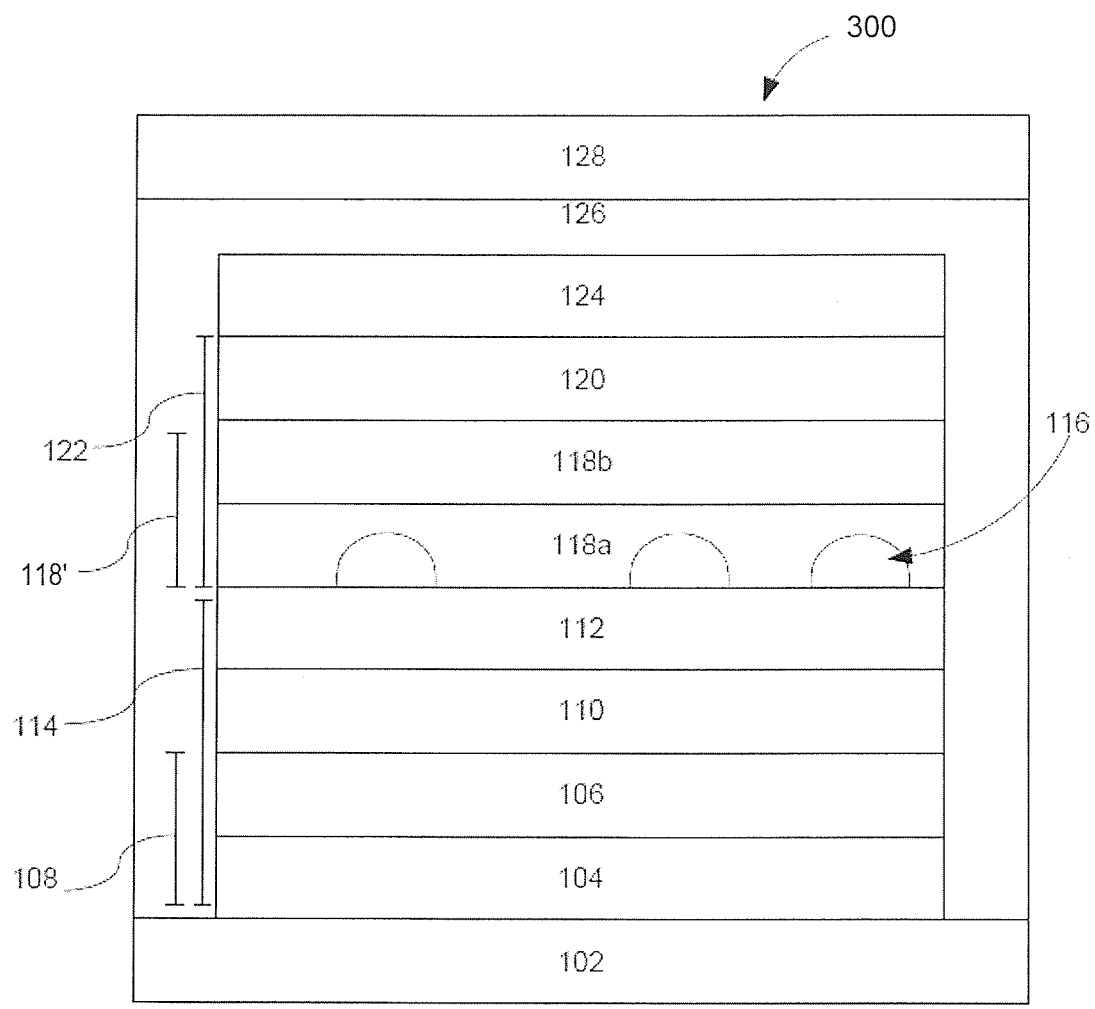
FIG. 3 shows a portion of a PV device in accordance with a disclosed embodiment.

FIG. 3 shows another example embodiment of a PV device 300 with similar layers (e.g., 102, 114, 116, 118, 120, 122, 124, 126, 128) to those discussed above with reference to FIG. 1. These layers can be deposited in the same manner described above with reference to FIG. 1 and have the same thicknesses. However, unlike in FIG. 1, the $CdS_xTe_{1-x}$ layer 118' in FIG. 3 is provided as two distinct sub-layers 118a, 118b, where the different sub-layers 118a, 118b have different sulfur and tellurium material compositions. In this embodiment, $CdS_xTe_{1-x}$ layer 118a has a greater sulfur concentration than $CdS_xTe_{1-x}$ layer 118b, although the concentration of sulfur in one or both of the layers 118a and 118b remains uniform within each layer. In another variant, one or both sub-layers 118a, 118b may have a varied sulfur concentration which decreases in the direction from the window layer 116 to the absorber layer 120. Thus one of sub-layers 118a, 118b may have a graded concentration such that x in the formula $CdS_xTe_{1-x}$ changes and is larger at the lowermost portion and smaller at the uppermost portion of the sub-layer, while the other of sub-layers 118a, 11b may be uniform. Or both of sub-layers 118a, 118b may have a varied or uniform sulfur concentration. Each of the sub-layers 118a, 118b can have a thickness in the range of greater than 0 and less than or equal to about 500 nm, for example about 250 nm.

As illustrated in the FIGS. 2 and 3 embodiments, the sulfur concentration in the $CdS_xTe_{1-x}$ material can be varied (FIG. 2), or uniform within $CdS_xTe_{1-x}$ layers (FIG. 3), or a combination of uniform and varied as in the FIG. 3 variant, over the thickness of the $CdS_xTe_{1-x}$ layer. In both embodiments of FIGS. 2 and 3, the value of x, and thus sulfur concentration, in the $CdS_xTe_{1-x}$ material becomes smaller as the $CdS_xTe_{1-x}$ layer approaches the absorber layer 120. In another embodiment, x can change gradually from between about 0.1 to about 0.02 over part of or over the entire thickness of the $CdS_xTe_{1-x}$ layer 118 (FIG. 2), or can change stepwise (FIG. 3) between about 0.1 for layer 118a and about 0.02 for layer 118b, as one example. In another example, x can change between about 0.3 to about 0.05 either gradually (FIG. 2) or stepwise (FIG. 3).

An additional advantage of the PV devices 100, 200, 300 of FIGS. 1-3 is that they reduce the problem of lattice mismatch between the CdS window and CdTe absorber layer. $CdS_xTe_{1-x}$ has a smaller lattice mismatch between it and CdS and between it and CdTe than occurs at a CdS/CdTe junction. The graded $CdS_xTe_{1-x}$ layer 118' (FIG. 2.) or the stepwise $CdS_xTe_{1-x}$ layers 118a, 118b (FIG. 3) further reduce the lattice mismatching between the CdS window layer 116 and the CdTe absorber layer 120. Since the CST layer 118 contains more sulfur closest to the window layer 116, there is less of a lattice mismatch between it and the window layer 116. Likewise, since the CST layer 118 has more Te closest to the absorber layer 120, there is less of a lattice mismatch between it and the absorber layer 120.

Figure 4:
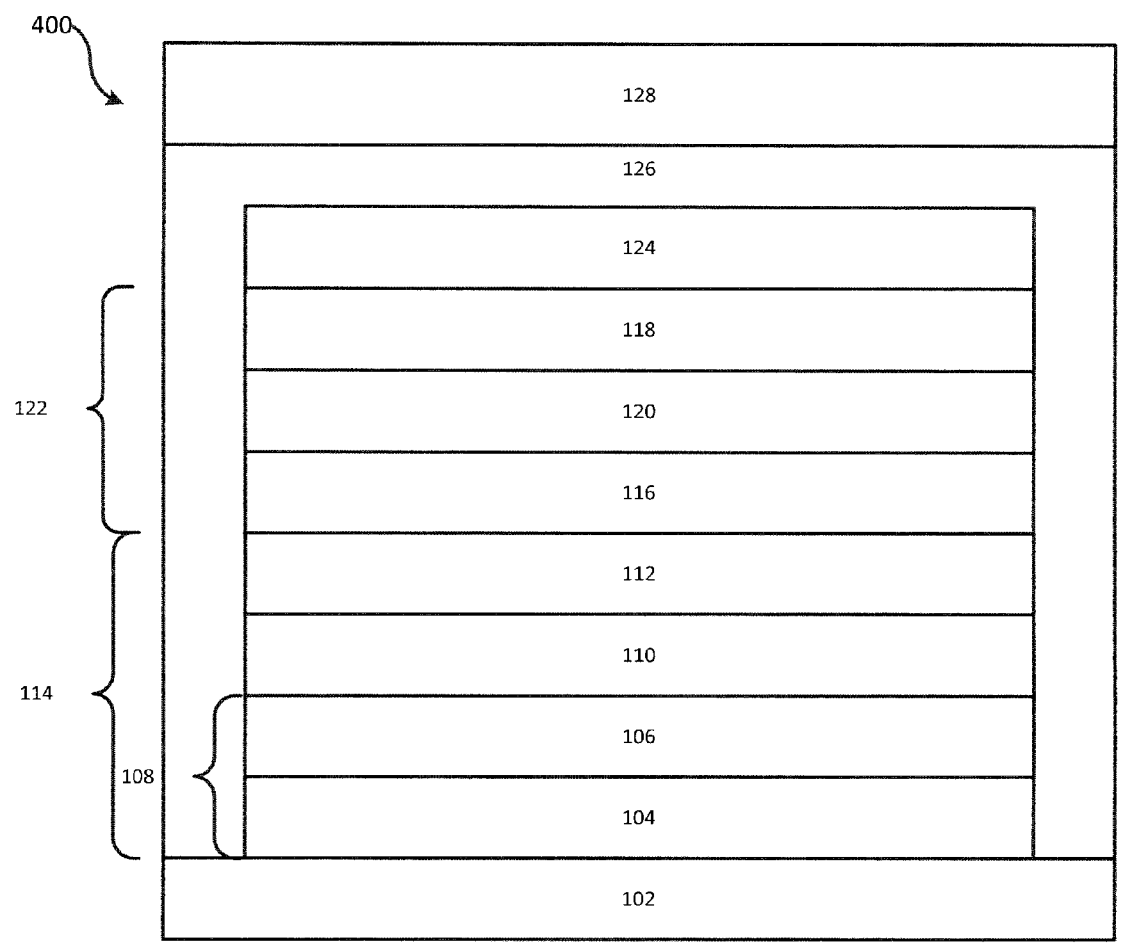
FIG. 4 shows a portion of a PV device in accordance with a disclosed embodiment.

FIG. 4 shows another example embodiment of a PV device 400 with similar layers (e.g., 102, 114, 116, 118, 120, 122, 124, 126, 128) to those discussed above with reference to FIG. 1. However, unlike in FIG. 1, the deposited $CdS_xTe_{1-x}$ layer 118 in FIG. 4 is provided over the absorber layer 120 and the window layer 116 is continuous as shown. Similarly to the PV device 100 of FIG. 1 discussed above, after the deposition of semiconductor multi-layer structure 122, a $CdCl_2$ activation treatment may ensue.

The $CdS_xTe_{1-x}$ layer 118 of FIG. 4 can be of materials similar to, formed in ways similar to, and have dimensions similar to the $CdS_xTe_{1-x}$ layer 118 of FIG. 1. During the formation of the absorber layer 120, deposition of pure CdTe can be changed to deposition of $CdS_xTe_{1-x}$. This can be accomplished by introducing sulfur vapor into the deposition zone while continuing the deposition of CdTe so that the gaseous sulfur and gaseous CdTe react to form $CdS_xTe_{1-x}$, as described above in relation to FIG. 1. The sulfur and tellurium content of the $CdS_xTe_{1-x}$ layer 118 of PV device 400 may similarly be uniform as in FIG. 1 or varied as described with respect to FIGS. 2 and 3 such that the composition can be varied in a graded or step-wise fashion.

A particular benefit of depositing the $CdS_xTe_{1-x}$ layer 118 over the absorber layer 120, as shown in FIG. 4, is that it may specifically improve surface passivation at the absorber's interface with the back contact layer 124. Improving the absorber/back contact interface improves efficiency by reducing losses at that interface, which may occur because of the differences in electrical characteristics of the materials typically used for the absorber and back contact, e.g., CdTe and metal, respectively. Additionally, depositing the $CdS_xTe_{1-x}$ layer 118 over the absorber layer 120 as shown in FIG. 4 is potentially easier to manufacture than depositing the $CdS_xTe_{1-x}$ layer 118 in other locations within a PV device because the $CdS_xTe_{1-x}$ layer 118 can simply be deposited over the absorber layer 120, using similar materials and similar deposition techniques as the absorber layer 120. Furthermore, the fluxing of the window layer 116 can be further controlled because the $CdS_xTe_{1-x}$ layer 118 is closer to where the $CdCl_2$ compound is applied thus maintaining a continuous window layer 116 even during aggressive $CdCl_2$ activation treatments.

Figure 5:
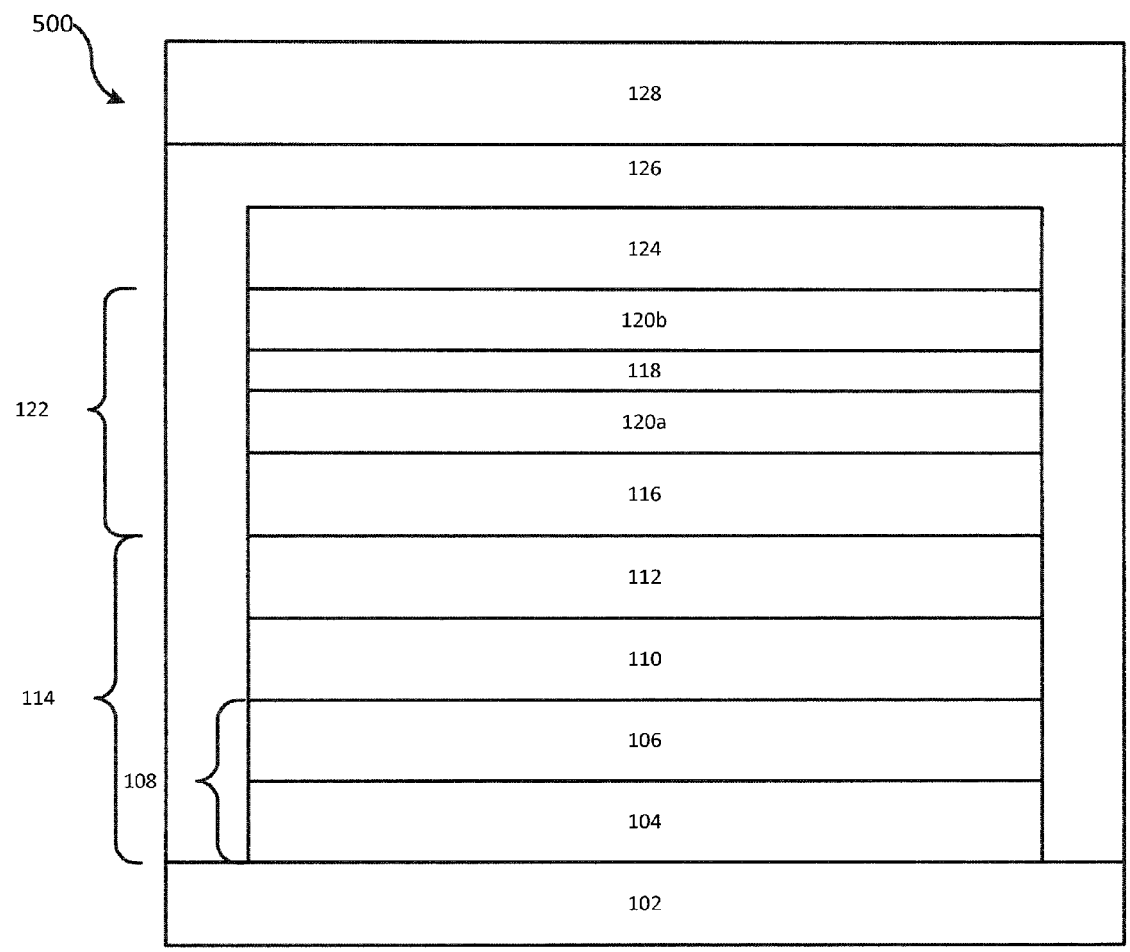
FIG. 5 shows a portion of a PV device in accordance with a disclosed embodiment.

FIG. 5 shows another example embodiment including a PV device 500 with similar layers (e.g., 102, 114, 116, 118, 120, 122, 124, 126, 128) to those discussed above in reference to FIG. 4; however, the $CdS_xTe_{1-x}$ layer 118 is deposited as a layer within the absorber layer 120, shown as two layers, absorber layers 120a, 120b.

The $CdS_xTe_{1-x}$ layer 118 of the PV device 500 of FIG. 5 can be of materials similar to, formed in ways similar to, and have dimensions similar to the $CdS_xTe_{1-x}$ layer 118 of FIG. 1. During the formation of the absorber layer 120a, deposition of pure CdTe is changed to deposition of $CdS_xTe_{1-x}$. This can be accomplished by introducing sulfur vapor into the deposition zone while continuing the deposition of CdTe so that the gaseous sulfur and gaseous CdTe react to form $CdS_xTe_{1-x}$, as described above in relation to FIG. 1. After the $CdS_xTe_{1-x}$ layer 118 is formed to the desired thickness, the deposition process returns to deposition of CdTe without sulfur to complete the absorber layer 120b. The sulfur and tellurium content of the $CdS_xTe_{1-x}$ layer 118 of PV device 500 may similarly be uniform as in FIG. 1 or varied as described with respect to FIGS. 2 and 3 such that the composition can be varied in a graded or step-wise fashion.

Depositing the $CdS_xTe_{1-x}$ layer 118 in the location shown in FIG. 5 can provide similar advantages to those achieved with the embodiment shown in FIG. 4. An added advantage of this embodiment is that the $CdS_xTe_{1-x}$ layer 118 is even more closely associated with the absorber layers 120a, 120b than in the embodiment shown in FIG. 4 because it is between the absorber layers 120a, 120b and, therefore, potentially can more homogeneously provide sulfur thereto and may more effectively control fluxing of sulfur form the window layer and passivate defects as discussed above.

Figure 6:
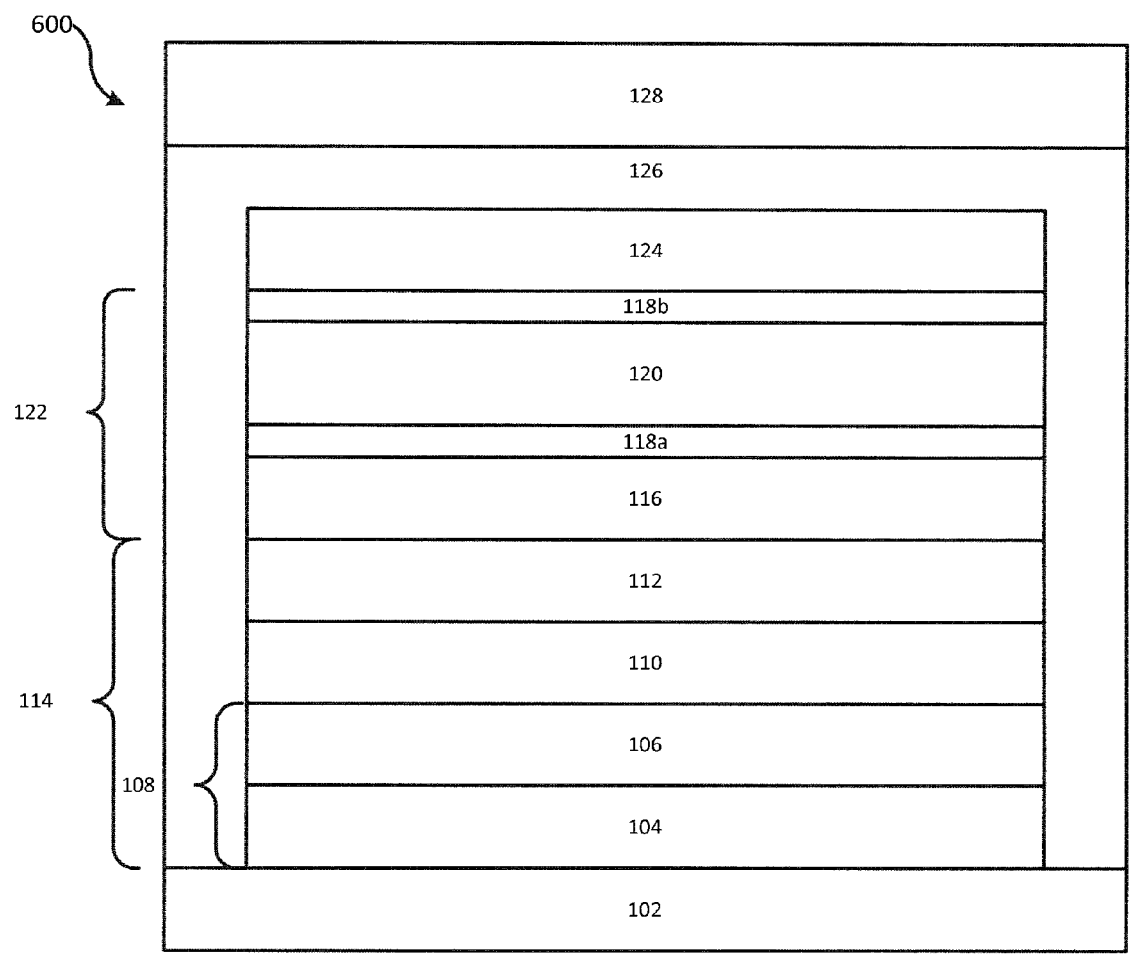
FIG. 6 shows a portion of a PV device in accordance with a disclosed embodiment.

FIG. 6 shows another example embodiment including a PV device 600 with similar layers (e.g., 102, 114, 116, 118, 120, 122, 124, 126, 128) to those discussed above in reference to FIG. 4; however, two $CdS_xTe_{1-x}$ layers 118a and 118b are deposited, with the absorber layer being over $CdS_xTe_{1-x}$ layer 118a and $CdS_xTe_{1-x}$ layer 118b being over absorber layer 120. The $CdS_xTe_{1-x}$ layers 118a, 118b of the PV device 600 of FIG. 6 can be of materials similar to, formed in ways similar to, and have thickness dimensions similar to the $CdS_xTe_{1-x}$ layer 118 of FIG. 1. The first $CdS_xTe_{1-x}$ layer 118a, deposited between the window layer 116 and the absorber layer 120, functions as a part and an extension of the absorber layer 120. The sulfur and tellurium content of the $CdS_xTe_{1-x}$, layers 118a,118b of PV device 600 may similarly be uniform as in FIG. 1 or varied as described with respect to FIGS. 2 and 3 such that the composition can be varied in a graded or step-wise fashion.

Depositing the $CdS_xTe_{1-x}$ layers 118a, 118b as shown in FIG. 6 can provide the similar sulfur fluxing control and defect passivation advantages to those achieved with the PV device 400 shown in FIG. 4. An added advantage of this embodiment is the potential for more even distribution of sulfur to the absorber layer 120 from the $CdS_xTe_{1-x}$ layers 118a, 118b (compared to the embodiment shown in FIG. 4). Also, the proximity of the $CdS_xTe_{1-x}$ material to the interfaces of the absorber layer 120 and each of its adjacent layers, i.e., the window layer 116 and the back contact 124, may more readily passivate these respective interfaces.

Figure 7:
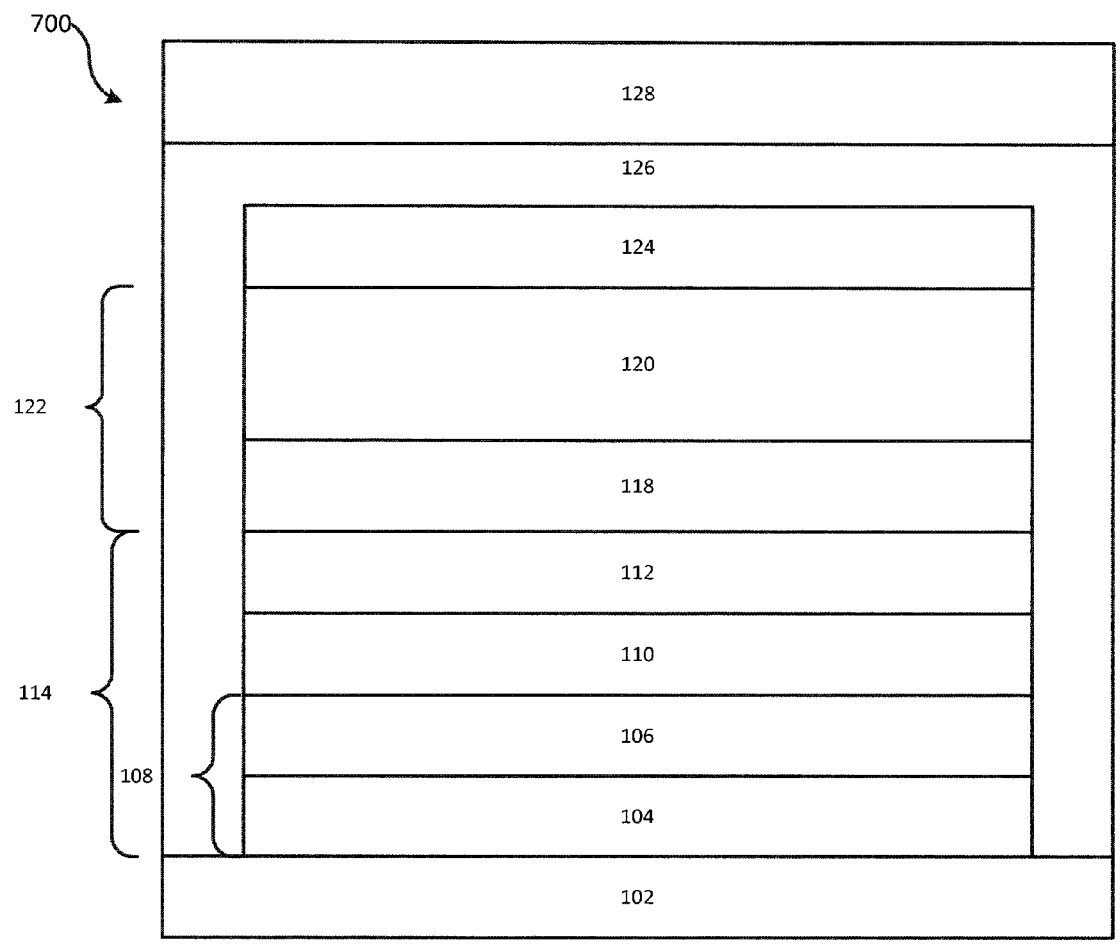
FIG. 7 shows a portion of a PV device in accordance with a disclosed embodiment.

FIG. 7 shows another example embodiment including a PV device 700 with similar layers (e.g., 102, 114, 118, 120, 122, 124, 126, 128) to those discussed above in reference to FIG. 4, but without a window layer. In this embodiment, the $CdS_xTe_{1-x}$ layer 118 is deposited between the absorber layer 120 and the TCO stack 114 while the window layer (e.g., layer 116 of FIG. 4) is omitted entirely. The $CdS_xTe_{1-x}$ layer 118 of the PV device 700 of FIG. 7 can be of materials similar to, formed in ways similar to, and have thickness dimensions similar to the $CdS_xTe_{1-x}$ layer 118 of FIG. 1. The sulfur and tellurium content of the $CdS_xTe_{1-x}$ layer 118 of PV device 600 may similarly be uniform as in FIG. 1 or varied as described with respect to FIGS. 2 and 3 such that the composition can be varied in a graded or step-wise fashion.

In this embodiment, the $CdS_xTe_{1-x}$ layer 118 is considered to be and behaves as a part of the absorber layer 120, particularly after the fluxing of material caused by the $CdCl_2$ activation treatment. It is believed that a CdS window layer (e.g., window layer 116) is not necessary for photoconversion in the current embodiment. Without the CdS material, the desired p-n junction is provided by the junction between the buffer layer 112 (e.g., $SnO_2$ or ZnO, which are n-type materials) and the $CdS_xTe_{1-x}$, layer 118 (which is p-type material).

Depositing the $CdS_xTe_{1-x}$ layer 118 in the location shown in FIG. 7 can provide similar advantages to those achieved with the example structure shown in FIG. 1. Replacing the window layer 116 with the $CdS_xTe_{1-x}$ layer 118 also further improves the PV device efficiency because the CdS material typically used for the window layer 116 is relatively light absorbent, thus more photons can be absorbed by the $CdS_xTe_{1-x}$ layer 118 and the absorber layer 120 for photoconversion. In addition to these advantages, omitting a separate window layer 116 can reduce the steps needed in manufacturing the PV device 700 as well as the materials needed to produce the PV device 700 as compared to other disclosed embodiments.

Figure 7A:
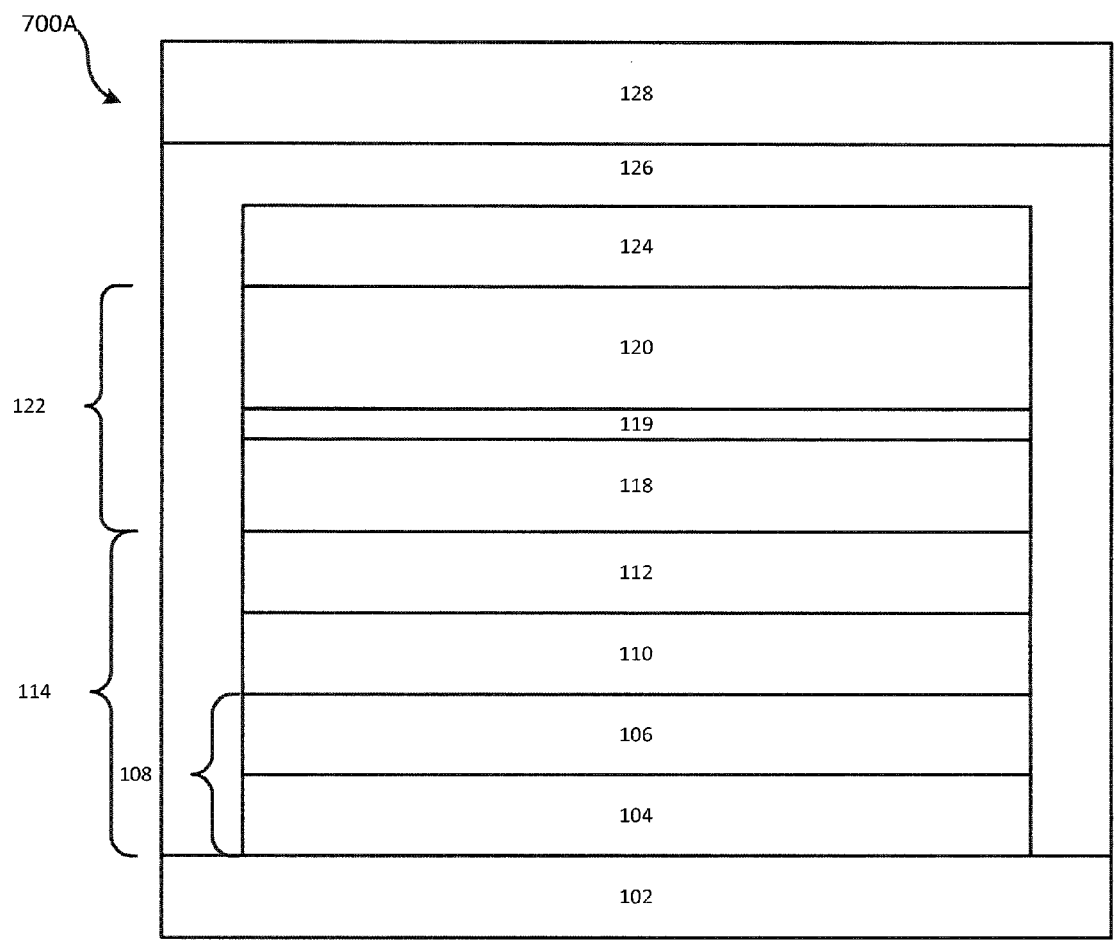
FIG. 7A shows a portion of a PV device in accordance with a disclosed embodiment.

FIG. 7A shows an additional example embodiment including a PV device 700A with similar layers (e.g., 102, 114, 118, 120, 122, 124, 126, 128) to those discussed above in reference to FIG. 7, also without a window layer, but including an additional sulfur-containing layer 119 between the $CdS_xTe_{1-x}$ layer 118 and the absorber layer 120. The additional sulfur-containing layer 119 of FIG. 7A may comprise a $CdS_{x2}Te_{1-x2}$ material (having a lower sulfur content than $CdS_xTe_{1-x}$ layer 118 (e.g., x2<x)), CdS, ZnS, $ZnO_xS_y$, or any combination thereof.

As in the embodiment of FIG. 7, the $CdS_xTe_{1-x}$ layer 118 of FIG. 7A is deposited between the absorber layer 120 and the TCO stack 114 while the window layer (e.g., layer 116 of FIG. 4) is omitted entirely. The $CdS_xTe_{1-x}$ layer 118 of the PV device 700A can be of materials similar to, formed in ways similar to, and have thickness dimensions similar to the $CdS_xTe_{1-x}$ layer 118 of FIG. 7. Alternatively, in the PV device 700A, the $CdS_xTe_{1-x}$ layer 118 includes values of x from about 0.05 to about 0.5, meaning that the atomic ratio of sulfur to total anion in the alloy material can be between about 5% to about 50% sulfur with the balance being tellurium. The sulfur and tellurium content of the $CdS_xTe_{1-x}$ layer 118 of PV device 700A may similarly be uniform as in FIG. 1 or varied as described with respect to FIGS. 2 and 3 such that the composition can be varied in a graded or step-wise fashion.

In addition to the advantages discussed with respect to FIG. 7 of the deposited $CdS_xTe_{1-x}$ layer 118, depositing the additional sulfur-containing layer 119 as shown in FIG. 7A allows for better control of sulfur fluxing and maintenance of the desired structure of $CdS_xTe_{1-x}$ layer 118 while also targeting defect passivation throughout the semiconductor multi-layer 122.

Figure 7B:
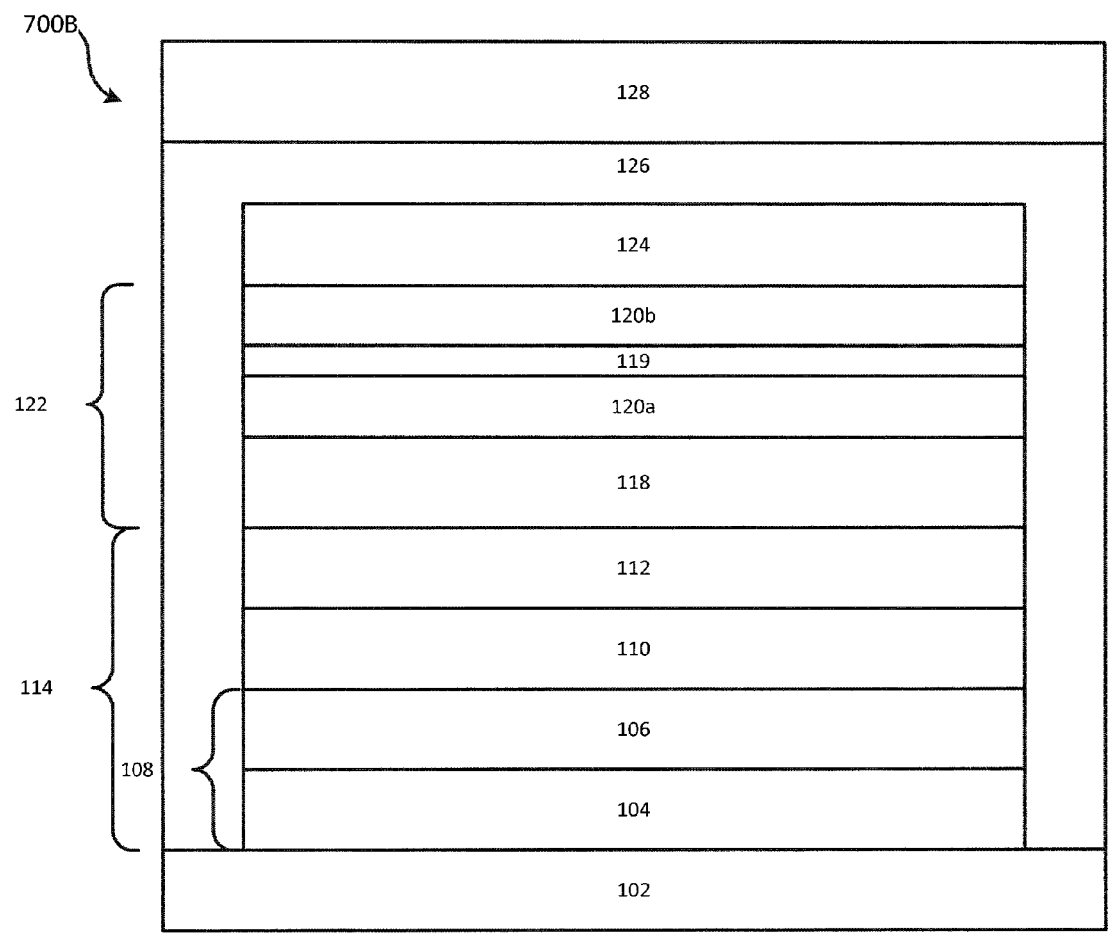
FIG. 7B shows a portion of a PV device in accordance with a disclosed embodiment.

FIG. 7B shows an additional example embodiment including a PV device 700B with similar layers (e.g., 102, 114, 118, 120, 122, 124, 126, 128) to those discussed above in reference to FIG. 7, also without a window layer, but including an additional sulfur-containing layer 119 within the absorber layer 120 (shown as two absorber sub-layers 120a, 120b). The additional sulfur-containing layer 119 of FIG. 7B may comprise a $CdS_{x2}Te_{1-x2}$ material (having a lower sulfur content than $CdS_xTe_{1-x}$ layer 118 (e.g., x2<x)), CdS, ZnS, $ZnO_xS_y$, or any combination thereof.

As in the embodiment of FIG. 7, the $CdS_xTe_{1-x}$ layer 118 of FIG. 7B is deposited between the absorber layer 120 and the TCO stack 114 while the window layer (e.g., layer 116 of FIG. 4) is omitted entirely. The $CdS_xTe_{1-x}$ layer 118 of the PV device 700B can be of materials similar to, formed in ways similar to, and have thickness dimensions similar to the $CdS_xTe_{1-x}$ layer 118 of FIG. 7. Alternatively, in the PV device 700B, the $CdS_xTe_{1-x}$ layer 118 includes values of x from about 0.05 to about 0.5, meaning that the atomic ratio of sulfur to total anion in the alloy material can be between about 5% to about 50% sulfur with the balance being tellurium. The sulfur and tellurium content of the $CdS_xTe_{1-x}$ layer 118 of PV device 700B may similarly be uniform as in FIG. 1 or varied as described with respect to FIGS. 2 and 3 such that the composition can be varied in a graded or step-wise fashion.

In addition to the advantages discussed with respect to FIG. 7 of the deposited $CdS_xTe_{1-x}$ layer 118, depositing the additional sulfur-containing layer 119 as shown in FIG. 7B allows for better control of sulfur fluxing and maintenance of the desired structure of $CdS_xTe_{1-x}$ layer 118 while also targeting defect passivation throughout the semiconductor multi-layer 122.

Figure 7C:
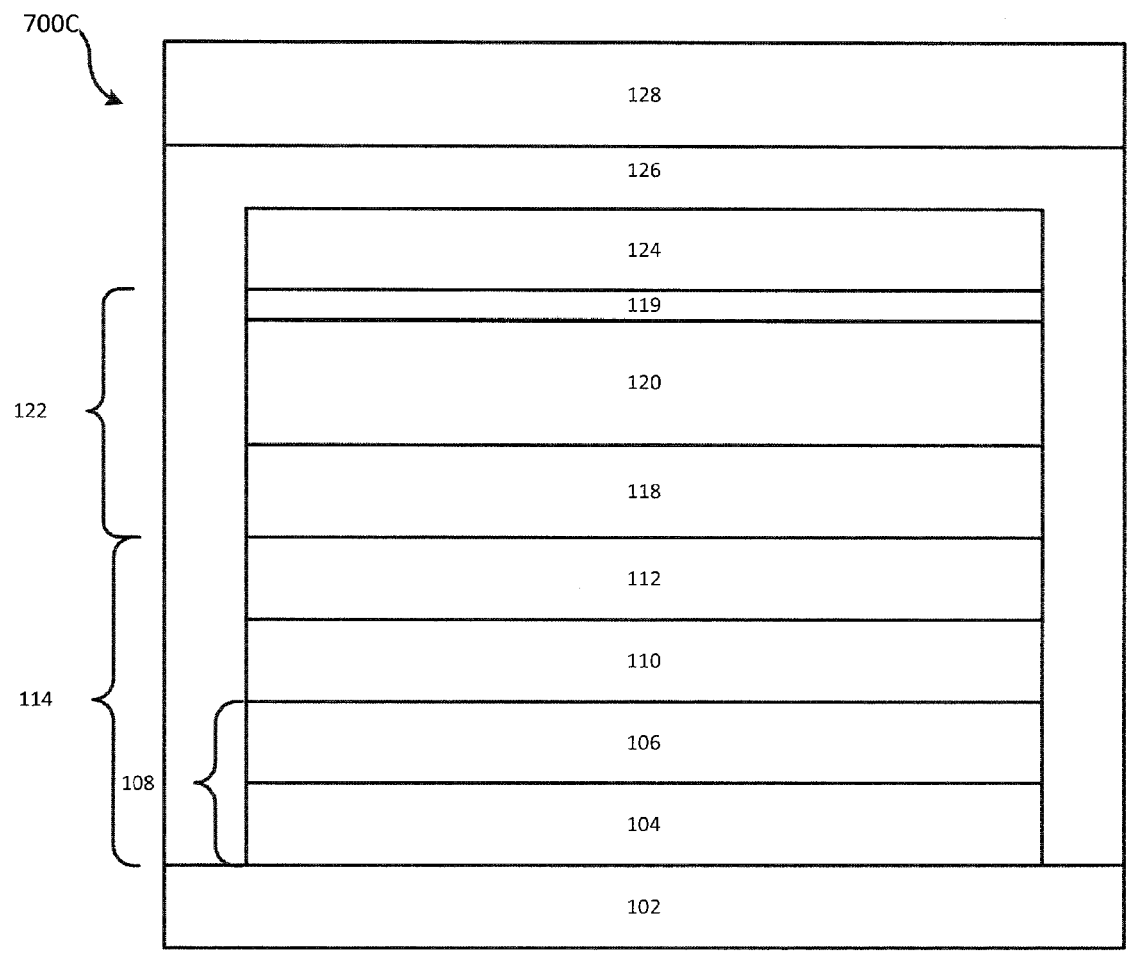
FIG. 7C shows a portion of a PV device in accordance with a disclosed embodiment.

FIG. 7C shows an additional example embodiment including a PV device 700C with similar layers (e.g., 102, 114, 118, 120, 122, 124, 126, 128) to those discussed above in reference to FIG. 7, also without a window layer, but including an additional sulfur-containing layer 119 over the absorber layer 120. The additional sulfur-containing layer 119 of FIG. 7C may comprise a $CdS_{x2}Te_{1-x2}$ material (having a lower sulfur content than $CdS_xTe_{1-x}$ layer 118 (e.g., x2<x)), CdS, ZnS, $ZnO_xS_y$, or any combination thereof.

As in the embodiment of FIG. 7, the $CdS_xTe_{1-x}$ layer 118 of FIG. 7C is deposited between the absorber layer 120 and the TCO stack 114 while the window layer (e.g., layer 116 of FIG. 4) is omitted entirely. The $CdS_xTe_{1-x}$ layer 118 of the PV device 700C can be of materials similar to, formed in ways similar to, and have thickness dimensions similar to the $CdS_xTe_{1-x}$ layer 118 of FIG. 7. Alternatively, in the PV device 700C, the $CdS_xTe_{1-x}$ layer 118 includes values of x from about 0.05 to about 0.5, meaning that the atomic ratio of sulfur to total anion in the alloy material can be between about 5% to about 50% sulfur with the balance being tellurium. The sulfur and tellurium content of the $CdS_xTe_{1-x}$ layer 118 of PV device 700C may similarly be uniform as in FIG. 1 or varied as described with respect to FIGS. 2 and 3 such that the composition can be varied in a graded or step-wise fashion.

In addition to the advantages discussed with respect to FIG. 7 of the deposited $CdS_xTe_{1-x}$ layer 118, depositing the additional sulfur-containing layer 119 as shown in FIG. 7C allows for better control of sulfur fluxing and maintenance of the desired structure of $CdS_xTe_{1-x}$ layer 118 while also targeting defect passivation throughout the semiconductor multi-layer 122.

Figure 7D:
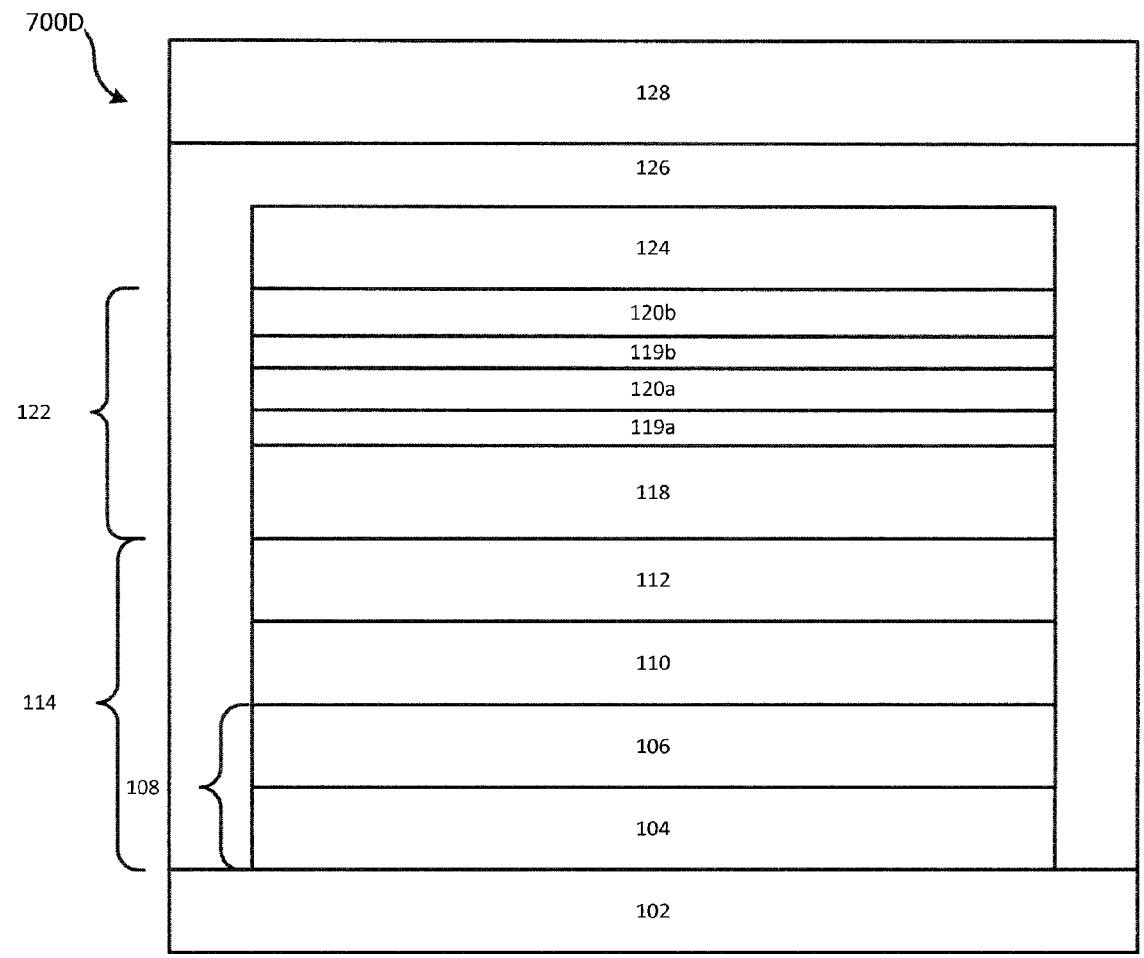
FIG. 7D shows a portion of a PV device in accordance with a disclosed embodiment.

FIG. 7D shows an additional example embodiment including a PV device 700D with similar layers (e.g., 102, 114, 118, 120, 122, 124, 126, 128) to those discussed above in reference to FIG. 7, also without a window layer, but including a first additional sulfur-containing layer 119a between the $CdS_xTe_{1-x}$ layer 118 and the absorber layer 120 (shown as two absorber sub-layers 120a, 120b) and a second additional sulfur-containing layer 119b within the absorber layer 120 (i.e. between absorber sub-layers 120a, 120b). Each of the additional sulfur-containing layers 119a, b of FIG. 7D may comprise a $CdS_{x2}Te_{1-x2}$ material (having a lower sulfur content than $CdS_xTe_{1-x}$ layer 118 (e.g., x2<x)), CdS, ZnS, $ZnO_xS_y$, or any combination thereof.

As in the embodiment of FIG. 7, the $CdS_xTe_{1-x}$ layer 118 of FIG. 7D is deposited between the absorber layer 120 and the TCO stack 114 while the window layer (e.g., layer 116 of FIG. 4) is omitted entirely. The $CdS_xTe_{1-x}$ layer 118 of the PV device 700D can be of materials similar to, formed in ways similar to, and have thickness dimensions similar to the $CdS_xTe_{1-x}$ layer 118 of FIG. 7. Alternatively, in the PV device 700D, the $CdS_xTe_{1-x}$ layer 118 includes values of x from about 0.05 to about 0.5, meaning that the atomic ratio of sulfur to total anion in the alloy material can be between about 5% to about 50% sulfur with the balance being tellurium. The sulfur and tellurium content of the $CdS_xTe_{1-x}$ layer 118 of PV device 700D may similarly be uniform as in FIG. 1 or varied as described with respect to FIGS. 2 and 3 such that the composition can be varied in a graded or step-wise fashion.

In addition to the advantages discussed with respect to FIG. 7 of the deposited $CdS_xTe_{1-x}$ layer 118, depositing the additional sulfur-containing layers 119a,b as shown in FIG. 7D allows for better control of sulfur fluxing and maintenance of the desired structure of $CdS_xTe_{1-x}$ layer 118 while also targeting defect passivation throughout the semiconductor multi-layer 122.

Figure 7E:
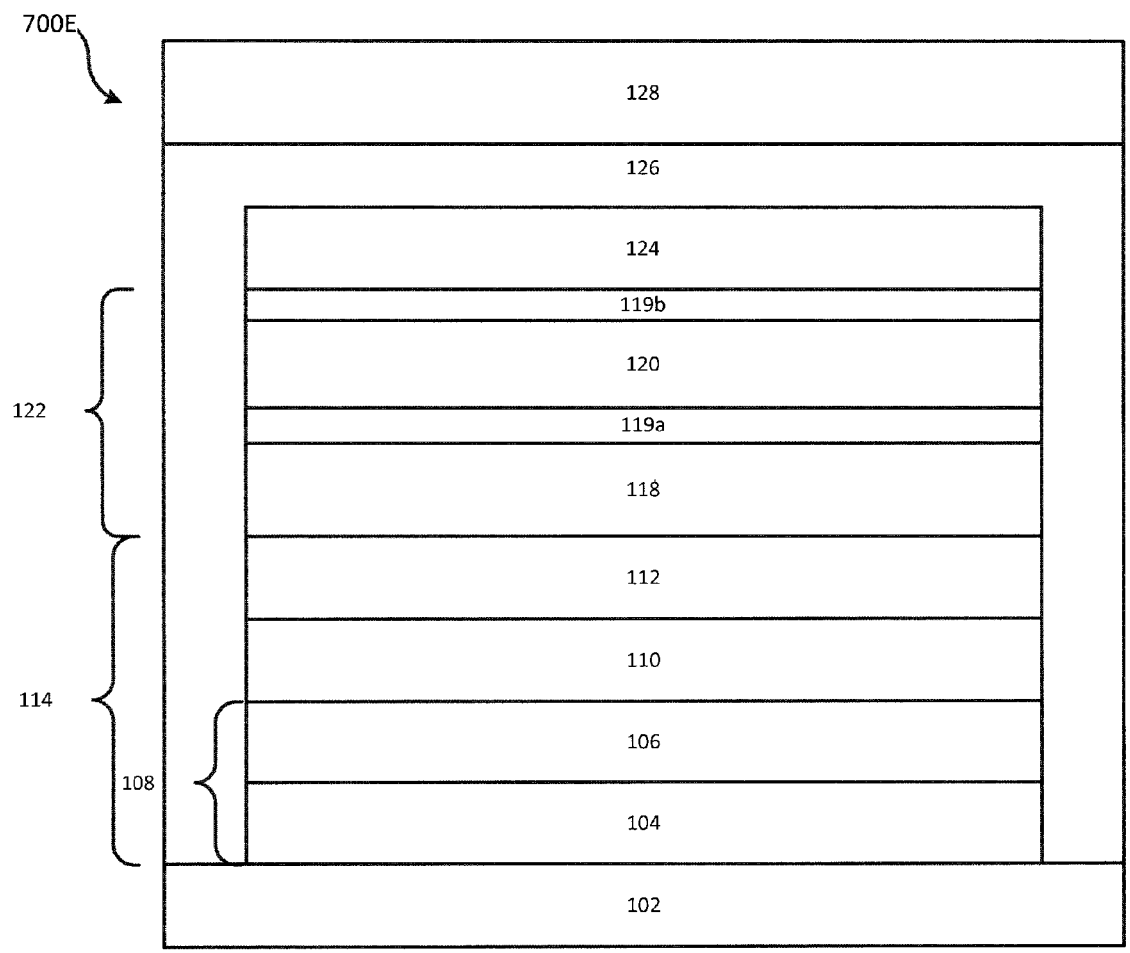
FIG. 7E shows a portion of a PV device in accordance with a disclosed embodiment.

FIG. 7E shows an additional example embodiment including a PV device 700E with similar layers (e.g., 102, 114, 118, 120, 122, 124, 126, 128) to those discussed above in reference to FIG. 7, also without a window layer, but including a first additional sulfur-containing layer 119a between the $CdS_xTe_{1-x}$ layer 118 and the absorber layer 120 and a second additional sulfur-containing layer 119b over the absorber layer 120. Each of the additional sulfur-containing layers 119a,b of FIG. 7E may comprise a $CdS_{x2}Te_{1-x2}$ material (having a lower sulfur content than $CdS_xTe_{1-x}$ layer 118 (e.g., x2<x)), CdS, ZnS, $ZnO_xS_y$, or any combination thereof.

As in the embodiment of FIG. 7, the $CdS_xTe_{1-x}$ layer 118 of FIG. 7E is deposited between the absorber layer 120 and the TCO stack 114 while the window layer (e.g., layer 116 of FIG. 4) is omitted entirely. The $CdS_xTe_{1-x}$ layer 118 of the PV device 700E can be of materials similar to, formed in ways similar to, and have thickness dimensions similar to the $CdS_xTe_{1-x}$ layer 118 of FIG. 7. Alternatively, in the PV device 700E, the $CdS_xTe_{1-x}$ layer 118 includes values of x from about 0.05 to about 0.5, meaning that the atomic ratio of sulfur to total anion in the alloy material can be between about 5% to about 50% sulfur with the balance being tellurium. The sulfur and tellurium content of the $CdS_xTe_{1-x}$ layer 118 of PV device 700E may similarly be uniform as in FIG. 1 or varied as described with respect to FIGS. 2 and 3 such that the composition can be varied in a graded or step-wise fashion.

In addition to the advantages discussed with respect to FIG. 7 of the deposited $CdS_xTe_{1-x}$ layer 118, depositing the additional sulfur-containing layers 119a,b as shown in FIG. 7E allows for better control of sulfur fluxing and maintenance of the desired structure of $CdS_xTe_{1-x}$ layer 118 while also targeting defect passivation throughout the semiconductor multi-layer 122.

Figure 8:
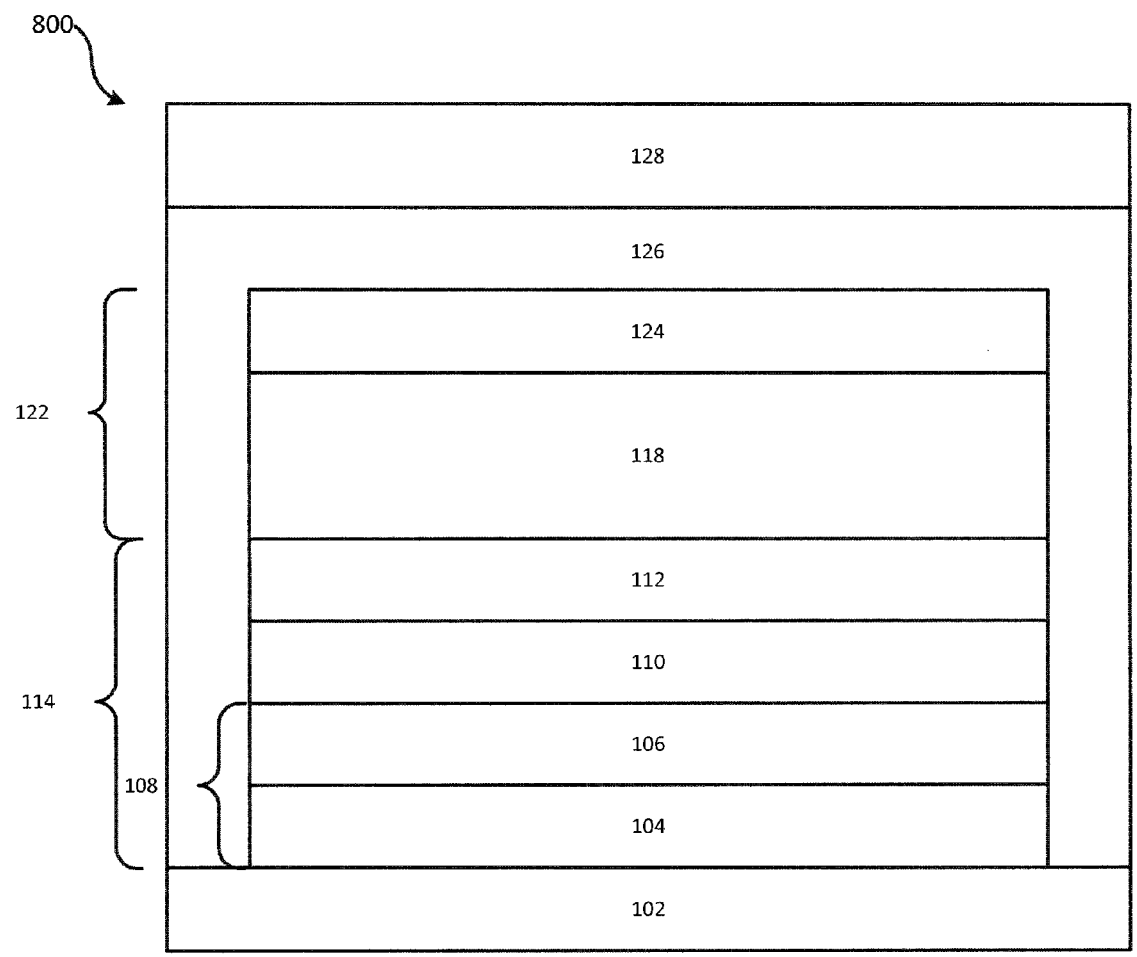
FIG. 8 shows a portion of a PV device in accordance with a disclosed embodiment.

FIG. 8 shows another example embodiment including a PV device 800 with similar layers (e.g., 102, 114, 118, 124, 126, 128) to those discussed above in reference to FIG. 4; however, this embodiment omits both the window layer and the absorber layer. In this example embodiment, the $CdS_xTe_{1-x}$ layer 118 is deposited between the TCO stack 114 and the back contact layer 124 and replaces both the window layer and absorber layer (e.g., layers 116, 120 of FIG. 4). In other words, the $CdS_xTe_{1-x}$ layer 118 itself serves the function of an absorber for the PV device 800 without the need for a separate, dedicated absorber layer, e.g., layer 120 of FIG. 4. Without the CdS/CdTe junction (of the omitted window layer and absorber layer), the desired p-n junction is provided by the junction between the buffer layer 108 (e.g., $SnO_2$ or ZnO, which are n-type materials) and the $CdS_xTe_{1-x}$ layer 118 (which is p-type material).

The $CdS_xTe_{1-x}$ layer 118 of the PV device 800 of FIG. 8 can be of materials similar to and formed in ways similar to the $CdS_xTe_{1-x}$ layer 118 of FIG. 1. However, in this embodiment, the $CdS_xTe_{1-x}$ layer 118 has a greater thickness than in other embodiments in order to function as an absorber layer. For example, the $CdS_xTe_{1-x}$ layer 118 of the PV device 800 can be about 2 µm to about 8 µm thick. An absorber thickness of about 3.3 µm is advantageous to effectively absorb the visible spectrum of light (a minimum 2 µm thickness is needed to fully absorb visible light) and also separate the absorption depth of the light within the layer from the associated back contact layer 118 so that photoconversion does not interfere with current at the absorber/back contact interface. Such interference can occur if the location of light absorption is too close to the absorber layer's interface with the back contact.

Furthermore, the $CdS_xTe_{1-x}$ layer 118 shown in FIG. 8 can have a single, fixed value for x, so that the $CdS_xTe_{1-x}$ composition is substantially maintained over its thickness. Alternatively, the $CdS_xTe_{1-x}$ layer 118 can be compositionally graded from front to back, as in the $CdS_xTe_{1-x}$ layers 118 of FIGS. 2 and 3 such that the portions of the $CdS_xTe_{1-x}$ layer 118 nearer the TCO stack 110 include a greater proportional amount of sulfur and the portions of the $CdS_xTe_{1-x}$ layer 118 nearer the back contact layer 118 include a greater proportional amount of tellurium. It is possible that x can change in this way from between about 1 to about 0 over part of or the entire thickness of the $CdS_xTe_{1-x}$ layer 118 of the PV device 800 of FIG. 8. The transition from x being about 1 to x being about 0 can be gradual over the thickness of the $CdS_xTe_{1-x}$ layer 118, as in the PV device 200 of FIG. 2. Alternatively, the transition can be staggered or abruptly change, as in a step-wise fashion, from the $CdS_xTe_{1-x}$ layer 118 being predominantly CdS to predominantly CdTe, as in the PV device 300 of FIG. 3.

In addition to the advantages discussed with respect to FIGS. 1-7, depositing the $CdS_xTe_{1-x}$ layer 118 as it is shown in FIG. 8 and omitting a separate window layer (e.g., layer 116) and absorber layer (e.g., layer 120) can reduce the steps needed in manufacturing the PV device 800 as well as the materials needed to produce the PV device 800.

The $CdS_xTe_{1-x}$ layer 118 of each of the disclosed embodiments may also be doped with copper. Doping with copper provides for increased p-type doping of the $CdS_xTe_{1-x}$ layer 118 and better allows for intermixing of the $CdS_xTe_{1-x}$ layer 118 and absorber layer 120. The copper-doped $CdS_xTe_{1-x}$ layer 118 may be formed, for example, using a vapor transport deposition (VTD) process, similar to that described above. Copper and sulfur are co-deposited into a CdTe layer during the VTD process. A copper source powder (such as, e.g., CuCl, $CuCl_2$, or $Cu_3N$) and a CdS powder are mixed with CdTe powder, in the desired Cu/S concentrations, to form a powder blend. As one example, in the powder blend, the copper source powder may have a concentration of 100-5000 ppm and the CdS may have a concentration of 0.1-20%. The powder blend is then vaporized at an elevated temperature and then condensed on the substrate, thus forming the copper-doped $CdS_xTe_{1-x}$ layer thereon. The as-deposited copper-doped $CdS_xTe_{1-x}$ layer may include copper in the range of 1-50 ppm. Copper may also be introduced via a secondary vaporizer to avoid the reaction with tellurium which forms Cu—Te compounds which have low volatility.

A general discussion of a method of deposition of the $CdS_xTe_{1-x}$ layer 118 of the disclosed embodiments is provided above with respect to the example embodiment of FIG. 1. These described techniques can be used to form any of the embodiments disclosed in FIGS. 1-8. However, it has been determined that the temperature of the TCO-coated substrate (onto which the $CdS_xTe_{1-x}$ layer 118, and the semiconductor window 116 and absorber 120 layers (where applicable) are deposited) during VTD deposition of $CdS_xTe_{1-x}$ layer 118 can have a significant impact on the grain size, packing density of the grains, adhesion, and film coverage on the plate. A deposited $CdS_xTe_{1-x}$ layer 118 should have large grain size, high packing density and cover the entire plate. The temperature of the TCO-coated substrate during deposition of the $CdS_xTe_{1-x}$ layer 118 can be controlled by adjusting the settings of the heaters in various transport sections and distribution zones of the VTD coater. Several example embodiments of controlling these temperature settings are now described with respect to FIG. 9.

Figure 9:
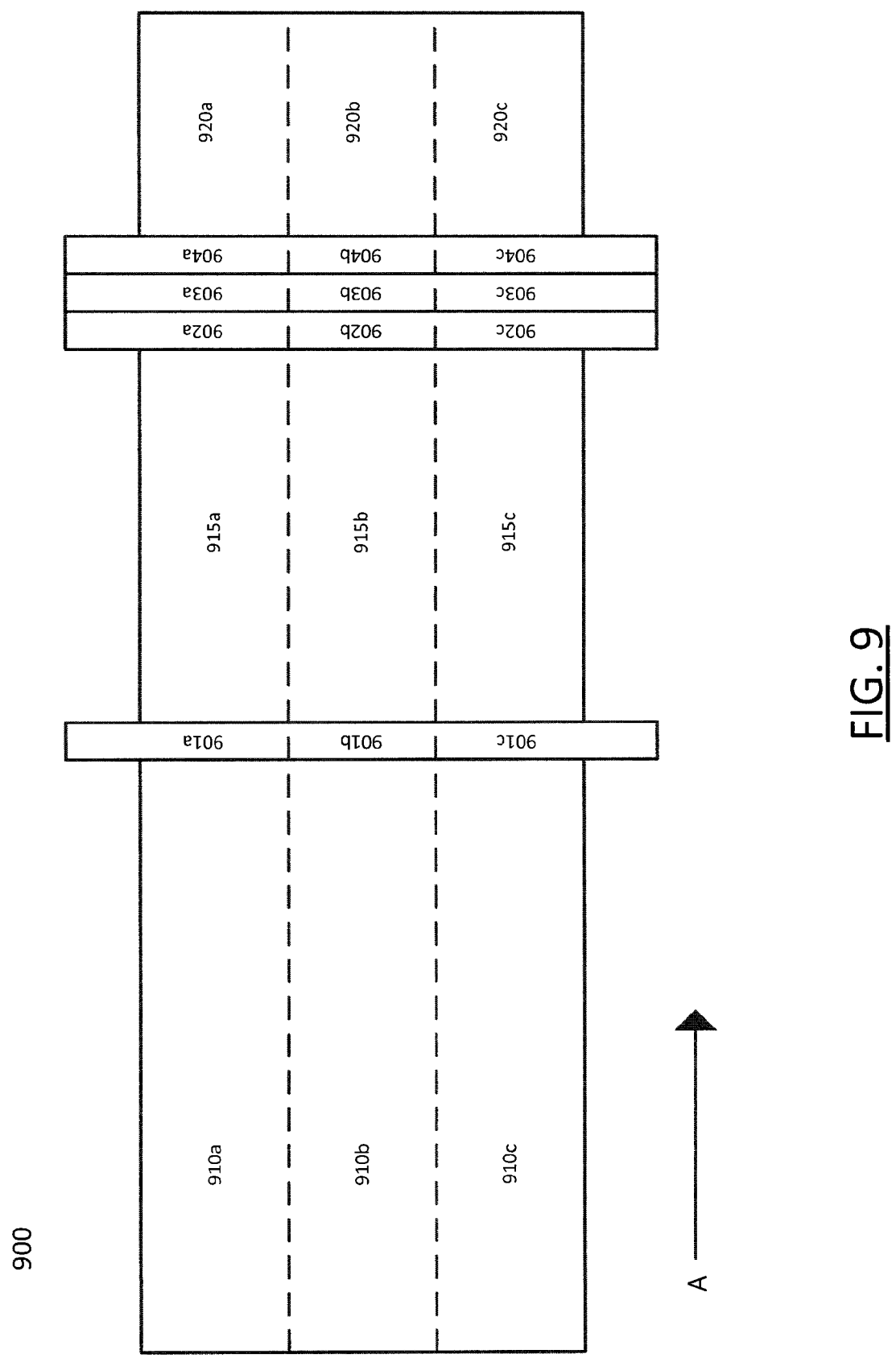
FIG. 9 is a schematic diagram of a VTD coater which can be configured to produce PV devices, in accordance with disclosed embodiments.

FIG. 9 shows a top down view of an example embodiment of a VTD coater 900 with the arrow "A" indicating a direction of conveyance of a substrate to be coated through the illustrated zones. Zones 910, 915 and 920 of coater 900 are conveyance zones, whereas distribution zones 901, 902, 903, 904 are zones at which material may be deposited onto a substrate, according to known VTD techniques, as discussed above. Depending on the particular process configuration, zones 910, 915 can be used for pre-heating the substrate and zone 920 can be heated to prevent the coated substrate from cooling too quickly after deposition. Distribution zones 901, 902, 903, 904 may be used for depositing a material but a material is not necessarily deposited at each of these zones, depending on the process configurations. Specific examples are discussed below. In the VTD coater 900, various heater settings may be used in different transverse sections of each of zones 910, 915, 920 of the coater 900. For example, each of sections 910a (side), 910b (center) and 910c (side) of zone 910 may have different heater settings. This is also true for sections 915a (side), 915b (center) and 915c (side) of zone 915, and sections 920a (side), 920b (center) and 920c (side) of zone 920. Similarly, each of distribution zones 901, 902, 903, 904 may use various heater settings at a center (b) and sides (a, c) thereof.

It has been discovered that control of the heater temperature settings as the substrate passes through the VTD coater 900 can be used to provide PV devices with improved efficiency as well as high open circuit voltage ("Voc") and high stability. For example, heater settings can be used to control $CdS_xTe_{1-x}$ film coverage on the plate (e.g., by using lower side temperatures than a center temperature in zone 915, just prior to $CdS_xTe_{1-x}$ deposition), reduce/eliminate "hopping" of the plate (e.g., when a cold plate enters zone 910, edges will become hot faster than the center; the temperature profiles of the disclosed embodiments, discussed below, in zone 910 reduce/eliminate this problem), and/or to provide a $CdS_xTe_{1-x}$ layer 118 with large grain size. The VTD coater 900 shown in FIG. 9 can be used for depositing material in any of the previously described embodiments, and additionally for structures including a semiconductor window layer, a $CdS_xTe_{1-x}$ layer and a semiconductor absorber layer deposited over a TCO stack.

One non-limiting example of particular heater settings for use in coater 900 is now described. In this example embodiment, coater 900 can be used for forming a PV module which includes $CdS_xTe_{1-x}$ layer 118, absorber layer 120 and no window layer (e.g., the embodiment of FIG. 4). In this example, a substrate 102, onto which a TCO stack 114 has already been deposited, enters the coater 900 at zone 910 and, traveling in the direction of arrow "A", passes through distribution zone 901, zone 915 and distribution zone 902. In this embodiment, no material is deposited until the substrate reaches distribution zone 903; thus, zones 910, 915 and distribution zones 901, 902 act to pre-heat the substrate prior to distribution zone 903. A $CdS_xTe_{1-x}$ layer 118 is deposited at distribution zone 903 and a CdTe absorber layer 120 is deposited at distribution zone 904. Zone 920 is a post-deposition zone of the coater 900.

In this example embodiment, the temperature in sections 910a, 910c can be about 535° C. and in section 910b can be about 625° C. The temperature in sections 915a, 915c can be about 510° C. and in section 915b can be about 600° C. Distribution zones 901 and 902 are kept at a temperature of about 600° C., across all sections 901a, 901b, 901c, 902a, 902b, 902c thereof. In each of zones 903, 904, where $CdS_xTe_{1-x}$ layer 118 and absorber layer 120, respectively, are deposited, heaters in outside sections (903a, 903c, 904a, 904c) may be set to about 940° C. and in the center section (903b, 904b) may be set to about 610° C. The temperature in sections 920a, 920c can be about 630° C. and in section 920b can be about 610° C., to prevent the coated module from cooling too quickly. In this example, $CdS_xTe_{1-x}$ layer 118 may be deposited using mixed CdTe—CdS or an alloy powder with a CdS concentration of about 25 mole %. It has been discovered that using the relatively lower side temperature heater settings in the zone 915 of coater 900 (e.g., the temperature in sections 915a, 915c is lower than the temperature in section 915b), as in this example, helps ensure full coverage of the $CdS_xTe_{1-x}$ film 118 on the plate. Further, using relatively lower side temperature heater settings in the zone 910 of coater 900 (e.g., the temperature in sections 910a, 910c is lower than the temperature in section 910b) helps prevent plate hopping.

Another non-limiting example embodiment of particular heater settings for use in coater 900 is now described. In this embodiment, coater 900 can be used for forming a PV module which includes, among other layers, a semiconductor window layer 116, a $CdS_xTe_{1-x}$ layer 118 and a semiconductor absorber layer 120, e.g. the embodiments of FIGS. 1-3 and 6, as well as other embodiments. In this example, a substrate 102, onto which a TCO 114 stack has already been deposited, enters the coater 900 at zone 910, traveling in the direction of arrow "A", and passes through distribution zone 901 and zone 915. In this embodiment, no material is deposited until the substrate reaches distribution zone 902; thus, zones 910, 915 and distribution zone 901 act to pre-heat the substrate prior to distribution zone 902. A CdS semiconductor window layer 116 is deposited at distribution zone 902, a $CdS_xTe_{1-x}$ layer 118 is deposited at distribution zone 903 and a CdTe absorber layer 120 is deposited at distribution zone 904. Zone 920 is a post-deposition zone of the coater. Additional layers may also be deposited and the order of layer deposition may be altered to form the other embodiments disclosed herein.

In this embodiment, the temperature in sections 910a, 910c can be about 535° C. and in section 910b can be about 625° C. The temperature in sections 915a, 915c can be about 510° C. and in section 915b can be about 600° C. Distribution zone 901 is kept at a temperature of about 600° C., across all sections 901a, 901b, 901c, thereof. Distribution zone 902, in which semiconductor window layer 116 is deposited, is kept at a temperature of about 600° C., across all sections 902a, 902b, 902c, thereof. In each of distribution zones 903 and 904, where $CdS_xTe_{1-x}$ layer 118 and absorber layer 120, respectively, are deposited, heaters in outside sections (903a, 903c, 904a, 904c) may be set to about 640° C. and in the center section (903b, 904b) may be set to about 610° C. The temperature in post-deposition sections 920a, 920c can be about 630° C. and in section 920b can be about 610° C., to prevent the coated module from cooling too quickly. In this example, $CdS_xTe_{1-x}$ layer 118 may be deposited from a $CdS_xTe_{1-x}$ powder feed with high CdS concentration, up to 90 mole %. Increased sulfur concentration in the $CdS_xTe_{1-x}$ powder produces PV modules having higher stability, and "wakeup" (wakeup refers to when the module begins generating current, for example, in the morning after not being exposed to sunlight all night) at high temperatures, which indicates the modules would be appropriate for operation in hot climates. As indicated above, using relatively lower side temperature heater settings in the zone 915 of coater 900 (e.g., the temperature in sections 915a, 915c is lower than the temperature in section 915b) helps ensure full coverage of the $CdS_xTe_{1-x}$ film 118 on the plate. Further, using relatively lower side temperature heater settings in the zone 910 of coater 900 (e.g., the temperature in sections 910a, 910c is lower than the temperature in section 910b) helps prevent plate hopping.

Another non-limiting example embodiment of particular heater settings for use in coater 900 is now described. In this embodiment, coater 900 can be used for forming a PV module which includes, among other layers, a semiconductor window layer 116, a $CdS_xTe_{1-x}$ layer 118 and a semiconductor absorber layer 120, e.g. the embodiments of FIGS. 1-3 and 6, as well as other embodiments. In this example, a substrate 102, onto which a TCO stack 114 has already been deposited, enters the coater 900 at zone 910 and travels in the direction of arrow "A". A CdS semiconductor window layer 116 is deposited at distribution zone 901. Zone 910 acts to pre-heat the substrate prior to deposition of the semiconductor window layer 116 in distribution zone 901. The substrate continues through zone 915. A $CdS_xTe_{1-x}$ layer 118 is deposited at zone 902 and a CdTe absorber layer 120 is deposited (in two parts) at zones 903, 904. Zone 920 is a post-deposition zone of the coater 900. This configuration, including the two part deposition of the CdTe absorber layer, allows for faster line speeds for production. Additional layers may also be deposited and the order of layer deposition may be altered to form the other embodiments disclosed herein.

In this embodiment, the temperature settings of the heaters in sections 910a and 910c increase as the plate moves (in the direction of arrow "A") closer to distribution zone 901. For example, the heaters in sections 910a and 910c may have four different temperature settings, increasing in the direction of arrow "A" from about 525° C. to about 575° C. to about 650° C. to about 675° C., with center section 910b kept at a constant temperature of about 650° C. Combining this temperature ramp-up with the relatively lower side temperatures in pre-heating zone 910 even further reduces the problem of plate hopping, as compared to the embodiment using only the side/center temperature differential. In other embodiments, the temperature in zone 910b may also be increased in the direction of arrow "A" rather than being kept at a constant temperature. Distribution zone 901, in which semiconductor window layer 116 is deposited, is kept at a temperature of about 600° C., across all sections 901a, 901b, 901c, thereof. In zone 915, the temperature settings of the heaters in section 915b change as the plate moves (in the direction of arrow "A") closer to zone 902, similar to the temperature change in section 910a, 910c of zone 910. For example, section 915b may have four different temperature settings, increasing in the direction of arrow "A" from about 560° C. to about 590° C. to about 650° C., and then decreasing back to about 600° C., with side sections 915a, 915c kept at a constant temperature of about 550° C. This temperature configuration in zone 915 helps ensure both full coverage of the $CdS_xTe_{1-x}$ layer 118 on the substrate (since the sides are maintained at relatively lower temperatures than the center) and prevents unwanted re-sublimation of the deposited CdS layer 116 prior to deposition of the CST layer 118 (by maintaining an appropriate temperature). Distribution zone 902, in which $CdS_xTe_{1-x}$ layer 118 is deposited, is kept at a temperature of 600° C., across all sections 902a, 902b, 902c, thereof. In each of distribution zones 903, 904, where the absorber layer 120 is deposited, heaters in outside sections (903a, 903c, 904a, 904c) may be set to about 630° C. and in the center section (903b, 904b) may be set to about 600° C. In this example, $CdS_xTe_{1-x}$ layer 118 may be deposited from a $CdS_xTe_{1-x}$ powder feed with CdS concentration of about 5 mole %. The temperature in post-deposition sections 920a, 920c can be about 630° C. and in section 920b can be about 610° C., to prevent the coated module from cooling too quickly. Modules produced by a VTD coater using the temperature settings of this example embodiment yielded an efficiency enhancement of about 0.25%.

It should be noted that the specific temperatures described with respect to the embodiments of FIG. 9 are merely provided as examples. Other zone temperature settings, may be used, for example at varying transport speeds; however the zones should have similar relative zone temperatures as those described above in order to achieve the beneficial effects.

As discussed above, the PV modules 100, 200, 300, 400, 500, 600, 700, 700A-E, and 800 of any of the disclosed embodiments of FIGS. 1-8 can be fabricated beginning with a substrate layer 102, forming subsequent layers, e.g., 108, 110, 112, 116, 118, 120, 124, as relevant to the specific embodiment, in sequence over the substrate layer 102, or can be processed in a reverse sequence, beginning with a back cover 128. Also, the PV modules 100, 200, 300, 400, 500, 600, 700, 700A-E, and 800 can be partially pre-fabricated such that a substrate and front contact, e.g., layers 102 and 114, can be provided as a pre-fabricated and the remaining layers subsequently provided thereover. In addition, some layers illustrated may be omitted and the inter-layer 126 may be provided only on the sides of the other material layers and not between the back contact 124 and the back cover 128.

The aforementioned advantages relating to the provision of the $CdS_xTe_{1-x}$ layer 118 in the PV devices 100, 200, 300, 400, 500, 600, 700, 700A-E, and 800 are examples and non-limiting. Other advantages may be realized and the invention should not be limited to or by those discussed above.

Each layer described herein may include more than one layer or film. Additionally, each layer can cover all or a portion of the device and/or all or a portion of the underlying material. For example, a "layer" can include any amount of any material that contacts all or a portion of a surface. Further, it is also possible for distinct boundaries between disclosed layers to be lost during subsequent manufacturing steps. For example, during the $CdCl_2$ activation step, it is possible for part of the CST layer 118 material to diffuse into the absorber layer 120. This phenomenon, or intermingling, can cause distinct boundaries between layers 118 and 120, for example, to be blended such that the layers may not be separately discernible even when using Scanning or Transmission electron microscopy (SEM/TEM) imaging.

Although a number of embodiments have been described, it will be understood that various modifications can be made without departing from the scope of the invention. Also, it should also be understood that the appended drawings are not necessarily to scale, presenting a somewhat simplified representation of various features and basic principles of the invention. The invention is not intended to be limited by any portion o f the disclosure and is defined only by the appended claims.

What is claimed is:

1. A photovoltaic device, comprising:
   a buffer layer over a front contact, wherein the buffer layer comprises metal oxide; and
   a $CdS_xTe_{1-x}$ layer between the buffer layer and a back contact, wherein x is greater than 0 and less than 1, wherein x changes over a thickness of the $CdS_xTe_{1-x}$ layer such that x is larger where the $CdS_xTe_{1-x}$ layer is nearer the front contact and x is smaller where the $CdS_xTe_{1-x}$ layer is nearer the back contact,
   and wherein the photovoltaic device does not include a separate semiconductor absorber layer or a separate semiconductor window layer between the buffer layer and $CdS_xTe_{1-x}$ layer; and
   a p-n junction between the buffer layer and the $CdS_xTe_{1-x}$ layer,
   wherein the $CdS_xTe_{1-x}$ layer functions as a p-type absorber layer.

2. The photovoltaic device of claim 1, wherein the $CdS_xTe_{1-x}$ layer is graded in sulfur and tellurium content over a thickness of the $CdS_xTe_{1-x}$ layer in a step-wise fashion.

3. The photovoltaic device of claim 1, wherein the $CdS_xTe_{1-x}$ layer is graded in sulfur and tellurium content over a thickness of the $CdS_xTe_{1-x}$ layer in a gradual fashion.

4. The photovoltaic device of claim 1, wherein the $CdS_xTe_{1-x}$ layer is a copper-doped $CdS_xTe_{1-x}$ layer.

5. The photovoltaic device of claim 1, further comprising a semiconductor absorber layer between the $CdS_xTe_{1-x}$ layer and the back contact.

6. The photovoltaic device of claim 5, wherein x is between about 0.01 to about 0.30.

7. The photovoltaic device of claim 5, wherein the semiconductor absorber layer comprises sulfur provided by the $CdS_xTe_{1-x}$ layer.

8. The photovoltaic device of claim 5, wherein the $CdS_xTe_{1-x}$ layer is a copper-doped $CdS_xTe_{1-x}$ layer.

9. The photovoltaic device of claim 5, further comprising an additional sulfur-containing layer.

10. The photovoltaic device of claim 9, wherein the additional sulfur-containing layer is positioned between the $CdS_xTe_{1-x}$ layer and the semiconductor absorber layer.

11. The photovoltaic device of claim 9, wherein the additional sulfur-containing layer is positioned within the semiconductor absorber layer.

12. The photovoltaic device of claim 9, wherein the additional sulfur-containing layer is positioned between the semiconductor absorber layer and the back contact.

13. The photovoltaic device of claim 9, wherein x is between about 0.05 and 0.5.

14. The photovoltaic device of claim 9, wherein the additional sulfur-containing layer comprises a material selected from the group consisting of: CdS, ZnS, $ZnO_xS_y$, and $CdS_{x2}Te_{1-x2}$, where x2 <x.

15. A method forming a photovoltaic device, comprising:
depositing a $CdS_xTe_{1-x}$ layer over a buffer layer of a TCO stack deposited on a substrate, wherein the buffer layer comprises a metal oxide, whereby a separate semiconductor absorber layer or a separate semiconductor window layer is not disposed between the buffer layer and $CdS_xTe_{1-x}$ layer, wherein a p-n junction forms between the buffer layer and the $CdS_xTe_{1-x}$ layer, whereby the $CdS_xTe_{1-x}$ layer functions as a p-type absorber layer, wherein x is greater than 0 and less than 1, and wherein x changes over a thickness of the $CdS_xTe_{1-x}$ layer such that x is larger where the $CdS_xTe_{1-x}$ layer is nearer the front contact and x is smaller where the $CdS_xTe_{1-x}$ layer is nearer the back contact; and
depositing a semiconductor absorber layer over the $CdS_xTe_{1-x}$ layer;
wherein the $CdS_xTe_{1-x}$ layer and the semiconductor absorber layer are deposited using a vapor transport deposition (VTD) coater, and wherein the VTD coater has heater temperature settings such that a conveyance zone prior to a first distribution zone in which the $CdS_xTe_{1-x}$ layer is deposited, relative to a direction of movement of the substrate, has a higher temperature at a center of the conveyance zone and a lower temperature at sides of the conveyance zone.

16. The method of claim 15, wherein the VTD coater has heater temperature settings such that a pre-heat zone located prior to the conveyance zone, relative to the direction of movement of the substrate, has a higher temperature at a center of the pre-heat zone and a lower temperature at sides of the pre-heat zone.

17. The method of claim 16, wherein the temperature at the center of the conveyance zone is about 600° C. and the temperature at the sides of the conveyance zone is about 510° C., and wherein the temperature at the center of the pre-heat zone is about 625° C. and the temperature at the sides of the pre-heat zone is about 535° C.

18. The method of claim 17, wherein a temperature at sides of the first distribution zone is about 640° C. and a temperature at a center of the first distribution zone is about 610° C.

19. The method of claim 18, wherein the absorber layer is deposited at a second distribution zone, located after the first distribution zone, and wherein a temperature at sides of the second distribution zone is about 640° C. and a temperature at a center of the second distribution zone is about 610° C.

20. The method of claim 16, wherein the VTD coater further has heater temperature settings such that the temperature at the sides of the pre-heat zone is varied, along the direction of movement of the substrate.

21. The method of claim 20, wherein the temperature at the sides of the pre-heat zone is varied, along the direction of movement of the substrate, to be about 525° C., about 575° C., about 650° C., and about 675° C., in order, and the temperature at the center of the pre-heat zone is about 650° C.

22. The method of claim 15, wherein the VTD coater further has heater temperature settings such that the temperature at the center of the conveyance zone is varied, along the direction of movement of the substrate.

23. The method of claim 22, wherein the temperature at the center of the conveyance zone is varied, along the direction of movement of the substrate, to be about 560° C., about 590° C., about 650° C., and about 600° C., in order, and the temperatures at the sides of the conveyance zone are about 550° C.

24. The method of claim 15, wherein the absorber layer is deposited at a third distribution zone, located after the first distribution zone of the coater, and wherein a temperature at sides of the third distribution zone is about 630° C. and a at a center of the third distribution zone is about 600° C.

25. The method of claim 24, further comprising a fourth distribution zone, wherein the absorber layer is deposited at both the third and fourth distribution zones, and wherein a temperature at sides of the fourth distribution zone is about 630° C. and a at a center of the fourth distribution zone is about 600° C.

26. The photovoltaic device of claim 1, wherein the metal oxide is selected from the group consisting of: tin oxide, zinc oxide, and combinations thereof.

* * * * *